US011604727B2

(12) United States Patent
Johannes de Jong et al.

(10) Patent No.: US 11,604,727 B2
(45) Date of Patent: Mar. 14, 2023

(54) APPARATUS AND METHODS TO PROLONG LIFETIME OF MEMORIES

(71) Applicant: Arm Limited, Cambridge (GB)

(72) Inventors: Ireneus Johannes de Jong, Cambridge (GB); Andres Amaya Garcia, Bristol (GB); Stephan Diestelhorst, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/478,544

(22) PCT Filed: Jan. 9, 2018

(86) PCT No.: PCT/GB2018/050046
§ 371 (c)(1),
(2) Date: Jul. 17, 2019

(87) PCT Pub. No.: WO2018/134562
PCT Pub. Date: Jul. 26, 2018

(65) Prior Publication Data
US 2020/0050541 A1    Feb. 13, 2020

(30) Foreign Application Priority Data

Jan. 20, 2017 (GB) ...................... 1700982

(51) Int. Cl.
*G06F 12/02* (2006.01)
*G06F 12/0868* (2016.01)
(Continued)

(52) U.S. Cl.
CPC ........ *G06F 12/0246* (2013.01); *G06F 11/076* (2013.01); *G06F 12/0868* (2013.01);
(Continued)

(58) Field of Classification Search
CPC ............ G06F 12/0246; G06F 12/0868; G06F 12/0873; G06F 2212/72; G06F 2212/7208;
(Continued)

(56) References Cited

U.S. PATENT DOCUMENTS 9,122,588 B1 * 9/2015 Mondal ............... G06F 12/0246
9,524,236 B1 * 12/2016 Myung .................. G06F 13/18
(Continued)

FOREIGN PATENT DOCUMENTS

CN    102047341 A    5/2011
CN    103765392 A    4/2014
(Continued)

OTHER PUBLICATIONS

Examination Report under Section 18(3) App. No. GB1700982.0, dated Jun. 2, 2020, 3 Pages.
(Continued)

*Primary Examiner* — Tracy A Warren
(74) *Attorney, Agent, or Firm* — Berkeley Law & Technology Group, LLP

(57) ABSTRACT

Broadly speaking, embodiments of the present technique provide apparatus and methods for improved wear-levelling in (volatile and non-volatile) memories. In particular, the present wear-levelling techniques comprise moving static memory states within a memory, in order to substantially balance writes across all locations within the memory.

17 Claims, 12 Drawing Sheets

(51) Int. Cl.
*G06F 12/0873* (2016.01)
*G06F 11/07* (2006.01)
*G11C 11/409* (2006.01)

(52) U.S. Cl.
CPC ........ *G06F 12/0873* (2013.01); *G11C 11/409* (2013.01); *G06F 2212/7201* (2013.01); *G06F 2212/7211* (2013.01)

(58) Field of Classification Search
CPC ..... G06F 2212/7201; G06F 2212/7211; G06F 3/0616
See application file for complete search history.

(56) References Cited

U.S. PATENT DOCUMENTS

| | | | |
|---|---|---|---|
| 10,642,505 B1 * | 5/2020 | Kuzmin | G06F 3/0685 |
| 2005/0001243 A1 | 1/2005 | Yaoi et al. | |
| 2008/0320214 A1 | 12/2008 | Ma | |
| 2010/0017555 A1 | 1/2010 | Chang | |
| 2011/0082963 A1 | 4/2011 | Jeddeloh | |
| 2012/0246393 A1 | 9/2012 | Hashimoto | |
| 2012/0324299 A1 | 12/2012 | Moshayedi | |
| 2013/0205076 A1 | 8/2013 | Schuette et al. | |
| 2014/0208007 A1 | 7/2014 | Cohen | |
| 2014/0351493 A1 | 11/2014 | Iaculo | |
| 2016/0019141 A1 | 1/2016 | Sutardja | |

FOREIGN PATENT DOCUMENTS

| | | |
|---|---|---|
| CN | 103942010 A | 7/2014 |
| CN | 105354152 A | 2/2016 |
| EP | 1804169 A1 | 12/2006 |
| KR | 101576575 B1 | 12/2015 |
| WO | 2009108619 A1 | 9/2009 |
| WO | 2018134562 A1 | 7/2018 |

OTHER PUBLICATIONS

Notification Concerning Transmittal of International Preliminary Report on Patentability, App. No. PCT/GB2018/050046, Filed Jan. 9, 2018, dated Aug. 1, 2019, 16 Pages.
Notification of Transmittal of the International Search Report and the Written Opinion of the international Searching Authority, or the Declaration, App. No. PCT/GB2018/050046, dated Mar. 6, 2018, 1 Page.
International Search Report, App. No. PCT/GB2018/050046, dated Mar. 6, 2018, 5 Pages.
Written Opinion, App. No. PCT/GB2018/050046, dated Mar. 6, 2018, 17 Pages.
Combined Search and Examination Report under Sections 17 and 18(3), App. No. GB1700982.0, dated Apr. 20, 2017, 8 Pages.
Liu, "A Static Trigger Wear-leveling Strategy for Flash Memory," 2008 Fifth IEEE International Symposium on Embedded Computing (SEC 2008) Oct. 6-8, 2008, IEEE, pp. 255-259.
Chang, "improving Flash Wear-Leveling by Proactively Moving Static Data," IEEE Transactions on Computers, Jan. 2010, IEEE, vol. 59, pp. 53-59.
Perdue, "Wear Leveling," Spansion, Publication No. Wear_Leveling_AN, Revision 1, Issue Date Apr. 30, 2008, 5 Pages.
Micron, Technical Note Wear Leveling Techniques in NAND Flash Devices, https://www.micron.com/resource-details/4c9ed96c-89f9-45c4-8921-4875a17b5650, Jan. 10, 2008, 8 Pages.
Office Action, App. No. KR10-2019-7015289, dated Dec. 8, 2021, 11 Pages.
Notification of the First Office Action, App. No. CN201880005418.8, dated Dec. 1, 2022, 23 Pages.

* cited by examiner a)

b)

APPARATUS AND METHODS TO PROLONG LIFETIME OF MEMORIES

This application is filed under 35 USC § 371 and claims the benefit of priority to International Application No. PCT/GB2018/050046, filed on 9 Jan. 2018 and UK patent application number GB 17 00982.0 filed on 20 Jan. 2017, which are incorporated herein by reference in their entirety.

The present techniques generally relate to wear-levelling for memories, and in particular to moving static memory states within a memory.

Non-volatile memory (NVM) is a class of memory in which the memory cell or element does not lose its state after power supplied to the cell/element is removed. Examples of non-volatile memory devices include flash memory, magnetic computer storage devices (e.g. hard disks, floppy disks, and magnetic tape), and optical discs. Other examples of NVM devices include phase change memory (PCM/PCRAM) devices, resistive random access memory (RRAM/ReRAM) devices, and Correlated Electron Material (CEM/CeRAM) devices. In a phase change memory device, programming (writing) involves heating the memory cell to melt it, (which causes a change in resistance) and cooling to either a conductive crystalline state or a non-conductive amorphous state. In a resistive RAM device, programming involves changing the resistance across a dielectric solid-state material. A CeRAM device is formed (wholly or in part) from a Correlated Electron Material (CEM), which exhibits an abrupt conductive or insulative state transition arising from electron correlations rather than solid state structural phase changes.

Generally speaking, NVM cells or devices can be electrically erased and reprogrammed. However, NVM cells or devices often wear out over time due to repeated erase and reprogram cycles. This wearing can result in higher bit errors and eventually, may result in part of the NVM device being unable to store memory states. Flash memories typically have an endurance of $10^5$ program/erase cycles, PCMs typically between $10^7$ and $10^9$ program/erase cycles, CeRAM is expected to be on the order of $10^9$ program/erase cycles, while dynamic random access memories (DRAMs) support at least $10^{15}$ program/erase cycles. The wearing has different causes depending on the type of memory device. PCMs typically wear out because of the high temperature used when writing. The high temperature causes the PCM cell to physically expand and contract, which stresses the material in the cell. Flash memories wear out because successive program/erase cycles wear down the metal oxide layer in the bit cell.

The present applicant has recognised the need for improved techniques to increase the lifespan of memory devices that are subject to a high number of program/erase cycles and which may wear out.

According to a first aspect of the present technique there is provided a method of wear-levelling, the method comprising: identifying, within a storage system, a memory location storing static memory states; identifying a free memory location in a write heavy region within a memory of the storage system; and writing the stored static memory states to the free memory location in the write heavy region within the memory.

According to a second aspect of the present technique there is provided a storage system comprising: at least one cache; a memory; and a module for: identifying, within the storage system, a memory location storing static memory states; identifying a free memory location in a write heavy region within the memory; and writing the stored static memory states to the free memory location in the write heavy region within the memory.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

The techniques are diagrammatically illustrated, by way of example, in the accompanying drawings, in which.

Figure 1:
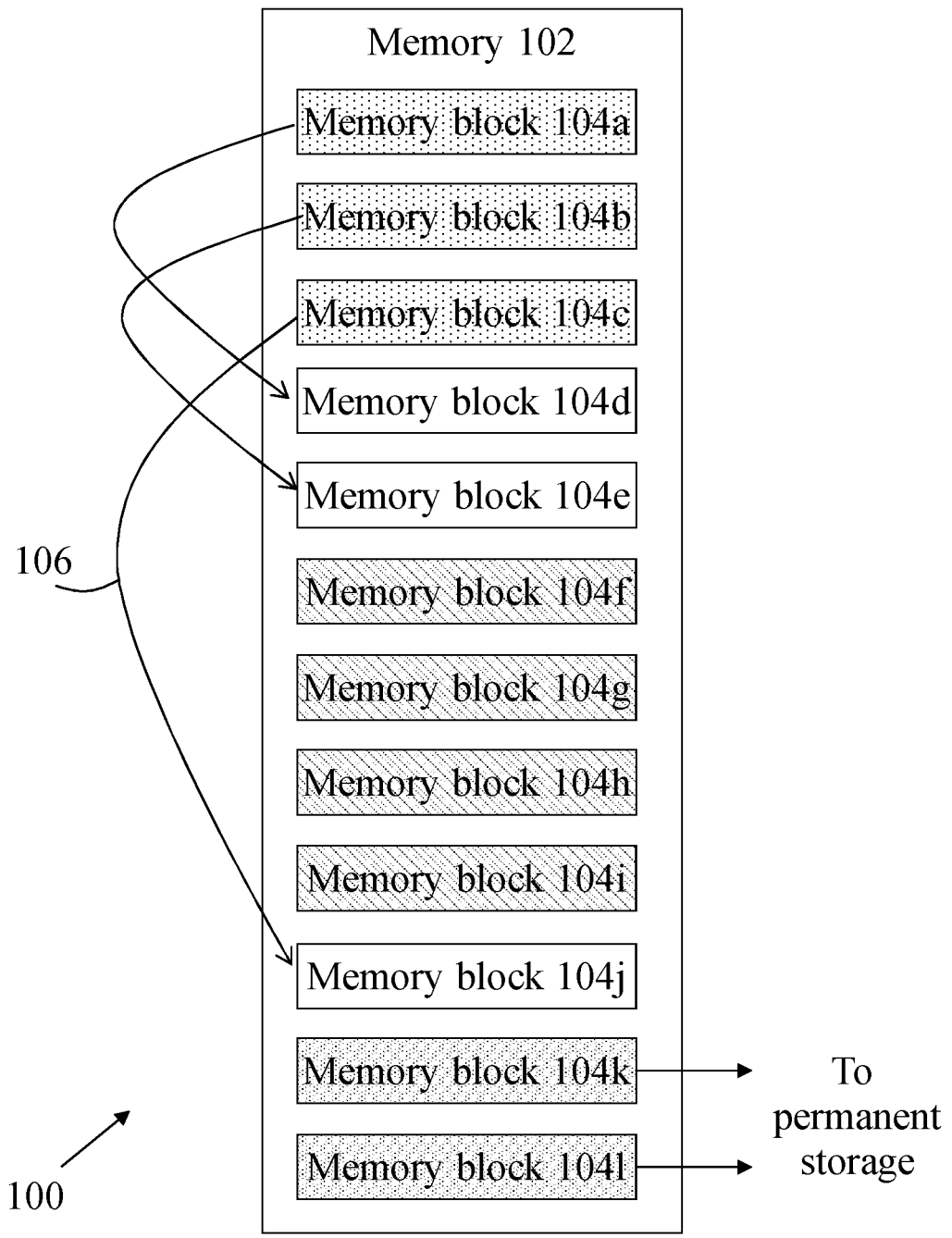
FIG. 1 shows a schematic of a prior art system of wear-levelling in a storage system.

Broadly speaking, embodiments of the present technique provide methods for improved wear-levelling in storage systems. The storage systems may comprise volatile memory and/or non-volatile memory, and the wear-levelling techniques described herein may be applied to both volatile and non-volatile memories. In particular, the present wear-levelling techniques comprise moving static memory states within a (volatile or non-volatile) memory, in order to substantially balance writes across all locations within the memory.

The present techniques are described below by reference to performing wear-levelling in non-volatile memories (NVMs). However, this is merely for the sake of simplicity and it will be understood that the present techniques may apply equally to, or be readily adapted for, performing wear-levelling in any type of memory which may wear out, including volatile memories (such as DRAM and SRAM). Therefore, the term "memory" is used herein to mean "non-volatile memory" and/or "volatile memory".

The present techniques perform wear-levelling by operating on blocks of memory. Generally speaking, memories are divided into blocks that can be used to store memory states. Each memory block is a group of one or more contiguous chunks of memory (e.g. one or more bytes). Each memory block is usually associated with an address, so that a CPU is able to implement instructions to read from and write to the memory block. A memory block may be any size, and may be of fixed size or of variable size. The smallest size of memory block in a memory/memory array may be equal to a cache line size, i.e. the minimum size of memory states accessible from the memory for copying into a cache. The cache line size may be 64 bytes, for example. A physical memory may be any size, for example 64 Gbytes. A memory may take the form of, or may comprise, a memory array, and the memory blocks may be located at equally-spaced addresses within the memory array.

The wear-levelling techniques described herein involve, broadly speaking, balancing writes substantially evenly across all memory blocks within a memory (i.e. a volatile and/or non-volatile memory). The term "memory block" is used interchangeably herein with the terms "memory location", "location", "region", "memory cell", "memory address", "memory page", "logical page", "logical address", "physical memory location", and "physical memory address".

A common way to perform wear-levelling is by performing 'out-of-place' writes, i.e. writing memory states to separate, free memory blocks within a memory (e.g. a volatile or non-volatile memory). However, writing and rewriting memory states to one location/memory block within a memory many times may cause locations within the memory to wear out relatively quickly (e.g. after $10^7$ writes). The act of writing (and rewriting) is also referred to herein as a "program/erase cycle" or "erase and reprogram cycle". Once a location within the memory has undergone repeated program/erase cycles, that location may be unable to store memory states. This may render the whole memory unusable, or less reliable. It is therefore generally desirable to spread out the writing of memory states across all locations/memory blocks within a memory, or as many memory blocks as possible, so that the device wears out after $n*10^7$ writes, where n is the number of memory blocks within the memory.

Memory states stored within a memory cannot simply be deleted or overwritten in order to free-up locations within the memory for new writes. Some of the memory states in the memory may be static memory states. Static memory states are memory states which are infrequently accessed, and which either do not change over time, or do not change as frequently as dynamic memory states. Static memory states are also referred to as persistent memory states. (It should be noted that static memory states or persistent memory states are not the same as memory states which are stored in 'persistent' types of storage, such as hard disks or non-volatile storage. Static/persistent memory states may be located anywhere, such as in cache, RAM or main memory, and is not exclusively found in persistent types of storage). Static memory states may be considered the opposite of dynamic memory states, which are memory states that may change frequently. One type of static memory states are read-only memory states. Another type of static memory states is read-rarely memory states. The term "static memory states" is used interchangeably herein with the terms "read-only memory states" and "read-rarely memory states".

The present wear-levelling techniques may be applied to a cache memory/CPU cache within a storage system, and/or to primary storage/main memory within a storage system. Primary storage/main memory is a storage type which is directly accessible to a CPU, and the CPU continuously reads instructions stored within the main memory and executes them as required. Memory states operated on by the CPU are stored within main memory. Main memory usually comprises RAM, which may be volatile (e.g. DRAM and SRAM) and/or non-volatile (e.g. NVRAM or flash memory). However, the present techniques may apply to any type of memory within a storage system, including cache(s), primary storage, secondary storage, tertiary storage and offline storage.

In cases where the static memory states are not accessed often or frequently from a memory of a storage system, the static memory states may be moved to a more permanent type of storage. For example, static memory states located within a cache of a storage system may be evicted from the cache and written to (or written back to) a primary storage of the storage system. In another example, static memory states located within primary storage may be moved to a more permanent type of storage. In this example, permanent storage may be secondary storage/auxiliary storage and is a type of non-volatile memory that is not directly accessible by a CPU. There are various different types of permanent storage, such as hard drives (e.g. solid state drives), optical discs, flash drives, magnetic disks, etc. Memory states stored in a permanent storage device are retrievable when required, but the retrieval process may take longer than retrieving memory states from cache and from main memory (primary memory). Therefore, only the static memory states stored in a primary memory which are determined to be unused/unaccessed are moved to the permanent storage. (Static memory states which are accessed relatively frequently need to be in a memory 'type' which enables faster retrieval, e.g. in a primary memory or in a CPU cache). Moving the unaccessed static memory states to permanent storage means that some memory locations within the main memory are free for new writes. This increases the effective lifetime of the main memory.

FIG. 1 shows a schematic of a prior art system of wear-levelling in a storage system 100. The storage system 100 comprises memory 102, and may comprise other components such as a cache and permanent memory/storage. The memory 102 is a physical memory, such as a volatile memory (e.g. SRAM, DRAM, etc.) or a non-volatile memory (e.g. flash memory, non-volatile RAM, etc.) The memory 102 is an addressable memory. For example, the memory 102 may be a byte-addressable non-volatile memory. The memory 102 is also referred to herein as "physical memory". The memory 102 comprises a plurality of locations or memory blocks 104a to 104l which are each able to store memory states (e.g. store memory states which are written to the memory 102). The memory blocks may be located at equally-spaced addresses/locations within the memory 102. Although FIG. 1 shows twelve such memory blocks, it will be understood that this is merely exemplary and that any number of memory blocks may exist within a physical memory. Each memory block 104a to 104l is addressed by its physical memory address (PA), such that write memory states can be written to a particular memory block in the physical memory 102 by sending the write memory states to the associated physical memory address.

In this illustrative prior art system, memory blocks 104a to 104c are write heavy locations within the physical memory 102. Write heavy locations (or write heavy regions) are positions within a physical memory which have been written to many times. For example, a write heavy location may have been written to more than an average number of writes across the whole memory. This means that the memory blocks 104a to 104c have been written to many times (and perhaps many more times than other locations within the physical memory 102). Memory blocks 104d, 104e and 104j have not been written to as many times as the write heavy locations, and are currently free/empty/unused. Thus, typical wear-levelling techniques involve moving memory states in write heavy locations to memory blocks which are available to store memory states (i.e. are empty/unused) and which are not as write heavy. Thus, as shown by arrows 106 in FIG. 1, memory states stored within the write heavy memory blocks 104a to 104c are moved to (or rewritten to) the free memory blocks 104d, 104e and 104j, in order to avoid wearing out the write heavy memory blocks. Memory blocks 104k and 104l store unused/unaccessed memory states, i.e. memory states which are not currently being accessed. The memory states stored within memory blocks 104k and 104l may be moved to a permanent memory/storage area if, for example, the memory states are determined not to have been accessed for a certain amount of time. This frees-up memory blocks 104k and 104l for new writes, which helps enable wear-levelling in the physical memory 102. Memory blocks 104f to 104i store static memory states. As mentioned above, the term 'static memory states' are used to mean memory states which do not change over time, or which do not change as frequently as dynamic memory states, but which is still read/accessed often enough for the memory states to be kept within the physical memory 102 rather than be moved to the permanent storage. Memory blocks 104f to 104i may therefore contain memory states which are read relatively frequently, but which do not change. A disadvantage of the prior art system of FIG. 1 is that there are relatively few memory blocks which can be used to implement wear-levelling in the physical memory 102.

The present techniques propose that static memory states which are accessed (and which therefore, cannot be moved to permanent storage) can be moved within a memory in order to make the less written-to locations within the memory available for new writes. Thus, the present techniques move static memory states within a memory to write heavy locations within the memory, and thereby make less used locations within the memory available for writes. The lifetime of the memory may be significantly increased by moving static memory states within the memory. For example, if a memory comprises S memory blocks, and each memory block has an endurance E (where endurance is the number of program/erase cycles that the can occur before the memory becomes unreliable/unusable), then the lifetime of the memory is equal to:

E writes, if memory states are only written and rewritten to a single memory block, and if wear-levelling is not performed; or E*S writes, if wear-levelling is performed across the memory.

Assuming that only one memory block of the memory is written to continuously, and that C memory blocks of the memory already store static memory states, then the lifetime of the memory is equal to:

E*(S−C) writes.

In other words, the more static memory states are stored in a memory, the closer the lifetime of the memory gets to the lifetime of a memory without wear-levelling. This is because the memory blocks C storing static memory states are not rewritten to, and cannot be used to for new writes. Therefore, the memory blocks C limit the amount of wear-levelling that can be performed, by limiting the number of memory blocks that can be used for new writes, and thereby reduce the effective lifetime of the memory. Accordingly, the theoretical maximum lifetime of a memory may be approached by moving static memory states within a memory.

The present techniques comprise a number of methods of identifying static memory states that are still accessed and which could be moved within a memory. These methods are described in more detail below.

In the following description of the present techniques, the term "memory" is used to mean, and is used interchangeably with, the terms "volatile memory", "non-volatile memory", "physical memory", "non-volatile memory device", "NVM", "NVM device", "non-volatile random access memory", "non-volatile memory array", "flash memory", "phase change memory", "resistive random access memory", "Correlated Electron Material memory", "CeRAM", "Correlated Electron Switch", "CES" or "Correlated Electron Switch (CES) element".

As mentioned above, the term "memory location" is used interchangeably herein with the terms "memory block", "location", "memory address", "memory page", "logical page", "logical address", "physical memory location", and "physical memory address". The term "memory location" is used herein to mean a location within a physical memory (e.g. a non-volatile memory or volatile memory) where memory states may be stored. A physical memory may comprise a memory array, and the memory blocks may be located at equally-spaced addresses within the memory array. Each memory block may be addressed by its physical memory address, such that write memory states can be written to a particular block in the physical memory (or memory array) by sending the write memory states to the associated physical memory address. Memory blocks may be any size. Memory blocks may be of a fixed size. The smallest size of memory block in the physical memory/memory array may be equal to a cache line size, i.e. the minimum size of memory states accessible from the memory for copying into a cache. The cache line size may be 64 bytes. A physical memory may be any size, for example 64 Gbytes.

Figure 2:
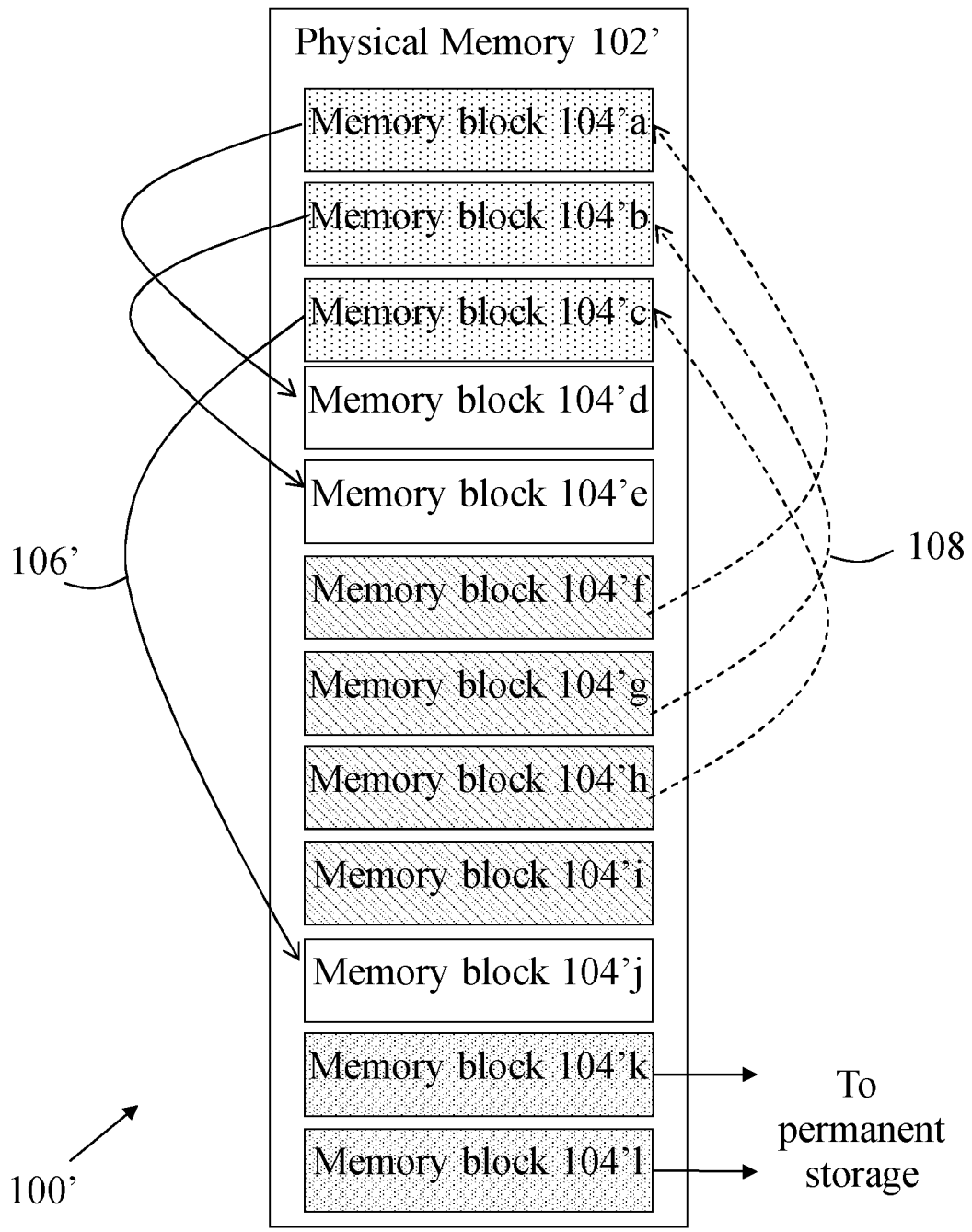
FIG. 2 shows a schematic of an improved system of wear-levelling in a storage system.

Turning to FIG. 2, this shows a schematic of an improved system of wear-levelling in a storage system 100', according to the present techniques. The storage system 100' comprises memory 102', and may comprise other components such as a cache and/or permanent memory/storage. The memory 102' is a physical memory, such as a volatile memory (e.g. SRAM, DRAM, etc.) or a non-volatile memory (e.g. flash memory, non-volatile RAM, etc.) The memory 102' is an addressable memory. For example, the memory 102' may be a byte-addressable non-volatile memory. The memory 102' is also referred to herein as "physical memory". The physical memory 102' may be, or may comprise, a non-volatile memory or non-volatile memory array. The physical memory 102' may be, or may comprise, a volatile memory or volatile memory array. The physical memory 102' may comprise flash memory, phase change memory, resistive random access memory, or Correlated Electron Material memory (CeRAM). The physical memory 102' comprises a plurality of locations or memory blocks 104'a to 104'l which are each able to store memory states (e.g. store memory states which are written to memory). The memory blocks may be located at equally-spaced addresses/locations within the physical memory 102'. The memory blocks may be of equal size. Alternatively, the memory blocks may not all be of the same size. Although FIG. 2 shows twelve memory blocks, it will be understood that this is merely for illustrative purposes, and that any number of memory blocks may exist within the physical memory 102'. Each memory block 104'a to 104'l is addressed by its physical memory address (PA), such that write memory states may be written to a particular memory block 104'a to 104'l in the physical memory 102' by sending the write memory states to the associated physical memory address. Similarly, the physical memory address may enable memory states stored within a memory block to be accessed/read.

In FIG. 2, memory blocks 104'a to 104'c are write heavy locations within the physical memory 102'. As explained earlier, write heavy locations (or write heavy regions) are positions within a physical memory which have been written to many times. For example, a write heavy location may have been written to more than an average number of writes across the whole memory. This means that the memory blocks 104'a to 104'c have been written to many times (and perhaps many more times than other locations within the physical memory 102'). Memory blocks 104'd, 104'e and 104'j are currently free/empty/unused locations within the physical memory 102'. If memory blocks 104'd, 104'e and 104'j have previously been written-to many times, they may not be suitable for performing wear-levelling and for spreading out writes across the physical memory 102', because they are themselves approaching their maximum number of program/erase cycles (also referred to herein as an endurance value).

In embodiments, if memory blocks 104'd, 104'e and 104'j have not been written to as many times as the write heavy locations, they may be used in a wear-levelling operation to spread out writes across the physical memory 102'. As explained above, typical wear-levelling techniques involve moving memory states in write heavy locations to memory blocks which are available to store memory states (i.e. are empty/unused) and which have not undergone as many program/erase cycles as the write heavy locations. Thus, as shown by arrows 106' in FIG. 2, memory states stored within the write heavy memory blocks 104'a to 104'c may be moved to (or rewritten to) the free memory blocks 104'd, 104'e and 104'j, in order to avoid wearing out (or overwearing) the write heavy memory blocks.

Memory blocks 104'k and 104'l may store unused/unaccessed memory states, i.e. memory states which are not currently being accessed. That is, memory blocks 104'k and 104'l may store static memory states which are not being accessed frequently enough for to warrant keeping the memory states in the physical memory 102'. The static memory states stored within memory blocks 104'k and 104'l may be moved to a permanent memory/storage area if, for example, the memory states are determined not to have been accessed for a certain amount of time. This frees-up memory blocks 104'k and 104'l for new writes, which helps enable wear-levelling in the physical memory 102'.

In FIG. 2, memory blocks 104'f to 104'i store static memory states. As mentioned above, the term 'static memory states' is used to mean memory states which do not change over time, or which do not change as frequently as dynamic memory states, but which is still read/accessed often enough for the memory states to be kept within the physical memory 102' rather than be moved to the permanent storage. Memory blocks 104'f to 104'i may therefore contain memory states which are read relatively frequently, but which do not change. Therefore, memory blocks which store static memory states (e.g. memory blocks 104'f to 104'i in FIG. 2) effectively limit the lifetime of the physical memory 102' by limiting the number of locations within the physical memory 102' which can be used to write memory states and implement wear-levelling. The present techniques provide methods to force migration of static memory states/read-only memory states within a physical memory in order to make more locations within the physical memory available for new writes, and in particular, for storing dynamic memory states which are written and rewritten many times. Although each migration of static memory states within a physical memory causes a new write to be performed, the migration may free-up a location within the memory which can withstand many more writes. Thus, by strategically migrating memory states/rewriting memory states within the memory, the overall lifetime of the memory may be increased.

In embodiments, when memory states stored within the write heavy memory blocks 104'a to 104'c are moved to (or rewritten to) the free memory blocks 104'd, 104'e and 104'j, the write heavy memory blocks become free to store memory states. To avoid wearing these write heavy memory blocks, dynamic memory states are preferably not written to these locations. Instead, static memory states stored within the physical memory 102' may be rewritten to/migrated to the write heavy memory blocks. Thus, as shown in FIG. 2 by dashed arrows 108, static memory states within memory blocks 104'f, 104'g, and 104'h are moved to the write heavy memory blocks 104'a, 104'b and 104'c. Although each migration of static memory states effectively results in an additional write in a write heavy location in the physical memory 102', an advantage is that memory blocks which used to store static memory states are now available for new writes/new memory states to be written to the memory, which enables wear-levelling to be performed over a greater number of memory blocks within the physical memory 102'. Thus, by moving static memory states within the physical memory 102', and in particular, moving static memory states to write heavy locations in the physical memory 102', the lifetime of the physical memory 102' may be increased as wear-levelling may be performed across more locations within the physical memory.

Thus, the present techniques propose that areas/memory blocks within a physical memory which store static memory states could be used to store dynamic memory states, to thereby substantially balance or spread-out the writing of memory states across all locations within a physical memory.

Figure 3:
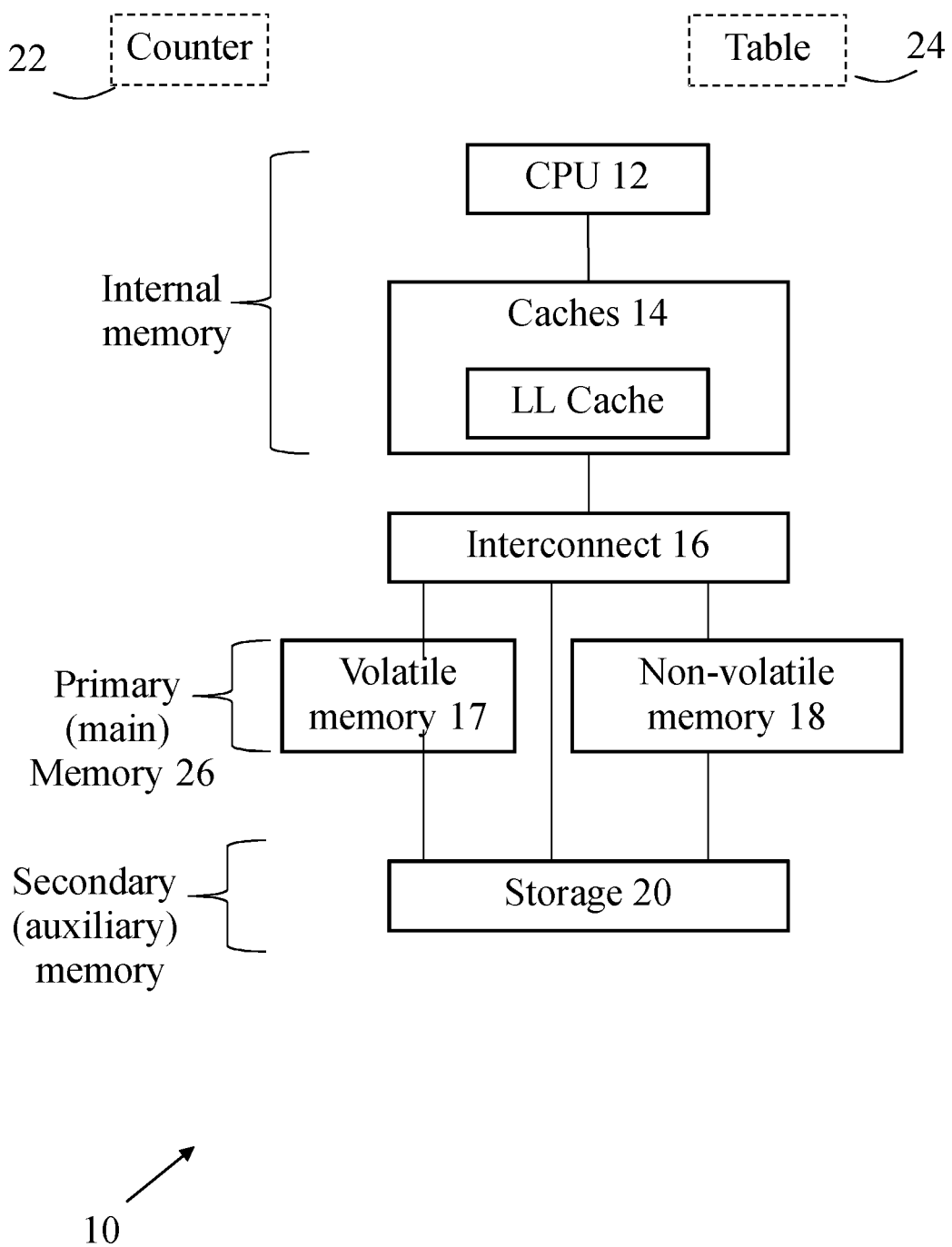
FIG. 3 shows a block diagram of a storage system.

FIG. 3 shows a block diagram of a memory system 10 (also referred to herein as a storage system). The storage system 10 comprises at least one central processing unit (CPU) 12 and a main memory 26 (also referred to herein as primary storage). The CPU 12 may fetch memory states/instructions from the main memory 26, store memory states into the main memory 26, etc. The memory system 10 may comprise at least one cache 14. The cache(s) 14 may be organised in hierarchy levels. The highest-level cache is the last cache called before accessing the main memory 26. FIG. 3 also shows the last level cache (LL Cache), which is the last cache called by the CPU 12 before accessing the main memory 26. Memory states which are accessed regularly/ frequently by the CPU 12, or which need to be accessed quickly, may be stored in one of the caches. The memory system 10 may comprise an interconnect 16 which provides an interface between the CPU(s) 12, the caches and the main memory 26.

The main memory 26 may comprise volatile memory 17, e.g. a random access memory (RAM). The main memory 26 may comprise non-volatile memory 18, e.g. a non-volatile RAM (NVRAM) or flash memory. The NVM 18 may comprise flash memory, phase change memory, resistive random access memory, or Correlated Electron Material memory (CeRAM). The volatile memory 17 and/or the NVM 18 may comprise a plurality of locations or memory blocks which are each able to store memory states (e.g. store memory states which are written to memory), as described earlier with reference to FIG. 2. The memory blocks may be located at equally-spaced addresses/locations within the memory 17, 18. Each memory block may be addressed by its physical memory address (PA), such that write memory states can be written to a particular memory block in the memory 17, 18 by sending the write memory states to the associated physical memory address.

Thus, in embodiments, the memory (which is being wear-levelled) of the storage system is a non-volatile memory. Additionally or alternatively, the memory being wear-levelled is a volatile memory. The memory may be, or may comprise, any one or more of: flash memory, phase change memory, resistive random access memory, RAM, DRAM, SRAM, non-volatile RAM, and Correlated Electron RAM (CeRAM).

The storage system may comprise a permanent storage 20 (also referred to herein as secondary storage or auxiliary memory). The memory 20 may be used to store memory states which are not accessed often, or which are currently not being accessed. As mentioned earlier, memory states which are stored in the main memory 26 but which are not currently being accessed may be moved to the memory 20. This frees-up memory blocks within the memory 17/18 for new writes, which helps enable wear-levelling in the memory 17/18.

The following description of the present techniques focusses on migrating memory states within the NVM 18 of storage system 10 in order to implement wear-levelling. However, it will be understood that the following techniques may equally apply to, or be readily adapted for, migrating memory states within volatile memory 17 of the storage system 10.

The present techniques move (or migrate) static memory states which are still accessed from the memory 18 to write heavy locations within the memory 18, and thereby make less-used locations within the memory 18 available for writes. The overall effective storage capacity of the memory 18 is thereby increased, and the lifetime of the memory 18 may be significantly increased. The present techniques comprise a number of methods of identifying static memory states that are still accessed and which could be moved within the memory 18. One way to do so is to determine when static memory states have been 'evicted' or removed from the cache(s) 14 (e.g. from the last level cache or any other level of cache within the cache hierarchy). Typically, memory states in a cache correspond to memory states stored within main memory 26. Memory states in the main memory 26 which need to be used quickly and/or often are copied into the cache and accessed by the CPU from the cache rather than the main memory 26. However, when the memory states in the cache are not required, the cached memory states may be evicted to free-up space within the cache. Memory states within the cache(s) may be evicted if the memory states are static memory states which have not changed, and possibly, which have not been accessed at a frequency that warrants the memory states remaining in the cache. There are various possible cache eviction algorithms/ schemes, which typically involve monitoring if memory states are being accessed from the cache and using this to decide if the memory states can be evicted from the cache. For example, static memory states (also referred to herein as "read-only memory states" or "clean memory states") may be evicted from the cache if they have not been accessed from the cache for a certain period of time: the cache eviction policy may decide to evict memory states which are not accessed frequently in favour of memory states which are accessed frequently and/or which need to be accessed quickly. In embodiments, static memory states may be evicted from the cache randomly. The cache eviction is described in more detail below.

Cache evictions of static memory states may indicate that some of the memory states stored in the main memory 26 (e.g. in NVM 18) may be static memory states that can be migrated. Memory states that have been evicted from the cache may be used to determine where static memory states are located within the memory 18, such that they can be migrated. The memory 18 may be made aware of where static memory states are located in a number of ways. For example, in embodiments, clean memory state evictions from the cache may be communicated to the physical memory 18. This communication may comprise sending a message or signal to the physical memory 18 containing information identifying the static memory states that have been evicted from the cache 14. The information identifying the evicted static memory states may be the address (physical/logical) associated with the static memory states. In this example, once the eviction has been communicated to the physical memory 18, the physical memory 18 may determine whether or not to migrate the evicted clean memory states within the physical memory. The decision may be based on a "read heaviness" of the memory block storing the evicted static memory states. The "read heaviness" is a measure of how many times memory states have been read from a particular memory block, or how many times memory states have been read from a particular memory block relative to the number of writes to the memory block. In other words, "read heaviness" is a measure of how often logical pages within the storage system 10 may be accessed and/or how often a logical page is clean evicted from the cache. The "read heaviness" may also take into account how often a logical page is modified and written back to the physical memory 18.

In another example, instead of communicating static memory states evictions to the physical memory 18, the cache 14 may evict static memory states and send an instruction to write the evicted static memory states back into the physical memory 18. In this case, the physical memory 18 may have some way of recognising that the memory states to be written into the memory has not changed (i.e. is unmodified relative to the memory states already stored within the physical memory 18 at the same location) and can therefore determine that the memory states are static memory states that have been evicted from the cache. As mentioned above, the physical memory 18 may then decide whether or not to migrate the static memory states within the physical memory.

In embodiments, the physical memory 18 may migrate static memory states within the physical memory every time a cache eviction occurs. This may be a simple wear-levelling technique to implement within a storage system. However, in some applications/scenarios, this may cause too many writes of (i.e. migrations of) static memory states to occur, which may not achieve the desired increase in memory lifetime.

In embodiments, the physical memory 18 may migrate static memory states every n cache evictions. In this case, the physical memory 18 may randomly select which static memory states to migrate, or may migrate the memory states corresponding to every nth cache eviction. This may be a relatively simple wear-levelling technique to implement, and would result in fewer writes than the above-mentioned embodiment which migrates memory states each time a cache eviction occurs. Therefore, the cost of implementing the wear-levelling technique to the endurance/lifetime of the memory is lower than the above-mentioned embodiment.

In embodiments, the "read heaviness" of logical pages within the memory system 10 may be monitored to determine when to migrate static memory states within the physical memory 18. As explained above, the "read heaviness" is a measure of how often logical pages within the storage system 10 may be accessed and/or how often a logical page is clean evicted from the cache 14. The "read heaviness" may also take into account how often a logical page is modified and written back to the physical memory 18. (Logical pages are associated with logical addresses (LAs). The logical addresses map to physical addresses (PAs) in the main memory 26. Programs and operations usually work in logical address space, and therefore, monitoring the "read heaviness" of logical pages/logical addresses may enable the memory system 10 to determine whether a logical page is static, or whether it is static and accessed regularly, or whether it is static and not accessed regularly, and so on). Tracking the read heaviness of logical pages within storage system 10 may enable locations in memory 18 which store static memory states to be identified, without having to track the locations within the memory 18 themselves. For example, it may be assumed that static memory states are stored in several memory blocks that have good locality. Tracking which logical pages are read multiple times in a row may allow locations in memory 18 which store static memory states to be identified.

The memory system 10 may optionally comprise a counter 22. Counter 22 may be used count the total number of clean memory state (static memory state) evictions from the cache(s) 14. As explained in more detail below, the number of static memory state evictions from the cache system may be used to determine when static memory states are to be migrated within the physical memory 18 to a write heavy location. The counter 22 may be a standalone element within memory system 10, or may be provided within the physical memory 18. The counter 22 is described in more detail below, e.g. with respect to FIG. 6.

The memory system 10 may optionally comprise a table 24. The table 24 may be used to track and store the number of static memory state evictions per memory location, or per memory block, or per logical page. The table 24 may be able to track how many times a logical page is read, which may indicate that the logical page comprises static memory states that could be migrated within the physical memory 18 to a write heavy location. The table 24 may track and store the "read heaviness" of each logical page. The table may be a hash table, hash map, or similar data structure. The table 24 may be provided in the cache system, as the static memory state evictions are performed in the cache. Preferably, the table 24 is provided within the physical memory 18. However, in this case, the memory system 10 requires a technique to communicate clean memory state evictions which occur in the cache 14 to the table 24 in the physical memory 18, or for the memory system 10 to be able to recognise when unmodified memory states are written back into the physical memory 18. The table 24 is described in more detail below with respect to FIGS. 8 and 9.

Thus, in embodiments there is provided a storage system comprising: at least one cache; a memory; and a module for (or suitable means for): identifying, within the storage system, a memory location storing static memory states; identifying a free memory location in a write heavy region within the memory; and writing the stored static memory states to the free memory location in the write heavy region within the memory.

Figure 4:
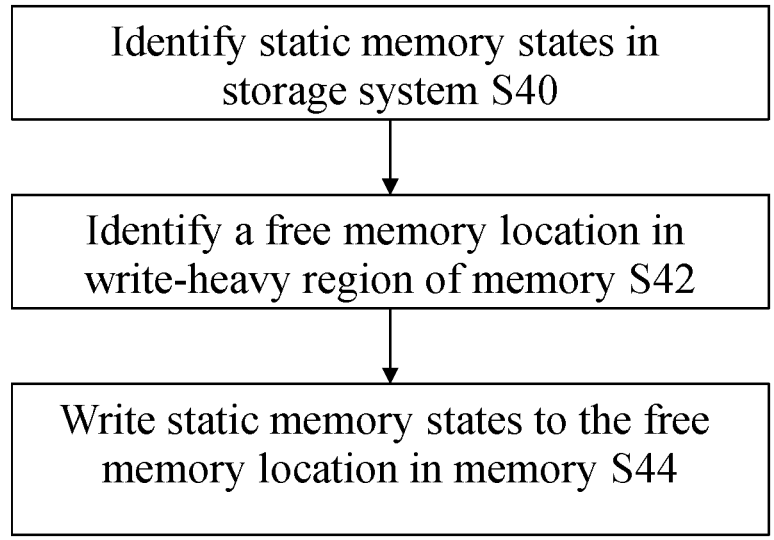
FIG. 4 is a flow diagram an example process to perform wear-levelling in a storage system.

FIG. 4 is a flow diagram of a process to perform wear-levelling in a memory system, such as in the storage system 10 of FIG. 3. The process begins by identifying static memory states/read-only memory states within a storage system (S40). The static memory states may be identified within a cache and/or a physical memory (e.g. a non-volatile memory) because, as explained above, static memory states may be identified by either the cache (which then passes the information to the physical memory), or by the physical memory. If a cache eviction policy is applied to evict static memory states from the cache, the cache may communicate the cache eviction to the physical memory, e.g. by communicating an address associated with the evicted static memory states or some other identifier of the evicted static memory states, or by sending the evicted static memory states back to the physical memory. In embodiments, static memory states may be identified by the physical memory, e.g. by observing that unmodified memory states have been sent to the physical memory with a write instruction. Thus, the operation of identifying static memory states may occur within the cache (e.g. via a cache eviction policy), or may occur within the physical memory (e.g. by determining that unmodified memory states have been sent to the physical memory). The read-only memory states (or static memory states) are memory states which have not changed, i.e. are not dynamic. The static memory states may be identified in a number of ways. For example, memory states which are accessed many times from the physical memory (or cache) without being rewritten may be assumed to be static memory states. In another example, memory states which are accessed from the physical memory (or cache) and are rewritten to the physical memory may be identified as static memory states if the rewritten memory states are determined to be unmodified. Memory states which are evicted from a cache may be assumed to be static memory states, because if the cache employs an eviction scheme, the cache will be configured to evict static memory states.

In embodiments, identifying static memory states in a storage system may comprise identifying a static page within the storage system. A page (also known as a memory page, or virtual page, or logical page) is a fixed-length contiguous block of virtual memory, described by a single entry in a page table. Each page may have a logical address (LA) which may be mapped to a physical address (PA) in the physical memory (e.g. non-volatile memory). The mapping between LAs and PAs is usually stored in a page table. Memory pages may comprise static memory states or dynamic memory states. Thus, S40 of the process of FIG. 4 may comprise identifying static memory pages within a storage system (e.g. storage system 10). The static memory pages may be found in the cache (e.g. cache 14)—in this case, the LA of a static memory page that is evicted from the cache may be communicated to a physical memory (e.g. volatile memory 17 or NVM 18), and the physical memory can map the LA to a PA to determine where in the physical memory the memory states are located. The memory states corresponding to a static memory page may be found in the physical memory—in this case, a cache may evict a memory page and send an instruction to rewrite the memory states into the physical memory at the physical address the memory states are already located at. The physical memory may determine that the incoming memory states to be written to the PA are the same as the memory states already stored at that PA, and therefore determines that the memory states stored at that PA are static memory states which could be migrated.

Once static memory states have been identified, the wear-levelling process comprises identifying a free memory location in a write heavy region within a memory of the storage system 10 (S42). The memory may be volatile memory 17 or NVM 18. As explained earlier, when memory states are migrated from a write heavy location to an empty/unused location or to a less-write heavy location, the write heavy location becomes available to store memory states. This newly-available write heavy location may preferably be used to store static memory states, as these are memory states which do not change, or do not change often, such that the memory states will not be written and rewritten to the storage system as often as dynamic memory states. Any technique may be used to identify a free memory location within a write heavy region or memory block of the storage system. For example, a table (e.g. table 24 in FIG. 3) may store the number of writes for each memory page/memory block, and may increment the number each time a write takes place in each memory block.

The wear-levelling process further comprises rewriting/migrating the identified static memory states to the identified free memory location within the memory 17/18 (S44). In doing so, the location in the memory where the static memory states were previously stored is now free to store memory states, preferably dynamic memory states. Thus, memory locations within the memory 17/18 become available when static memory states are migrated/moved to write heavy locations, thereby enabling writes to take place across more locations within the physical memory. Thus, performing wear-levelling which comprises migrating static memory states within a volatile/non-volatile memory may enable each memory block within the memory to be written to a maximum number of times (e.g. to an endurance value), so that all of the blocks fail at approximately the same time, instead of write heavy memory blocks failing much faster than other memory blocks.

Each of S40 to S44 shown in FIG. 4 may be implemented using software, hardware, or a combination of software and hardware. The hardware may be a memory controller, which may be located in the CPU 12, in the interconnect 16 and/or within the main memory 26. Preferably, the decision on whether to migrate static memory states within the physical memory 18 is made by software/hardware that is located in, or coupled to, or operating on, the physical memory 18.

Accordingly, there is provided a method of wear-levelling, the method comprising: identifying, within a storage system, a memory location storing static memory states; identifying a free memory location in a write heavy region within a memory of the storage system; and writing the stored static memory states to the free memory location in a write heavy region within the memory.

As mentioned earlier, the wear-levelling technique is applied to at least one memory of a storage system, such that static memory states identified within the memory are moved to a write heavy region within the memory. The memory may be (or may comprise) a volatile or a non-volatile memory. The location within the memory which stores static memory states may be identified via a cache of the storage system, or may be identified within the memory of the storage system itself, as explained earlier.

Thus, in embodiments, identifying a memory location storing static memory states may comprise identifying the memory location within a (non-volatile or volatile) memory of the storage system. In particular, identifying the memory location within a memory may comprise recognising when memory states to be written to the memory are identical to memory states already stored within the memory. Additionally or alternatively, in embodiments, identifying the memory location within a memory comprises receiving a logical address associated with static memory states (e.g. from a cache or other component of the storage system), and determining a corresponding physical address of the static memory states within the memory using a mapping table.

A number of example techniques for identifying static memory states, and determining whether or not to migrate static memory states are now described.

Figure 5:
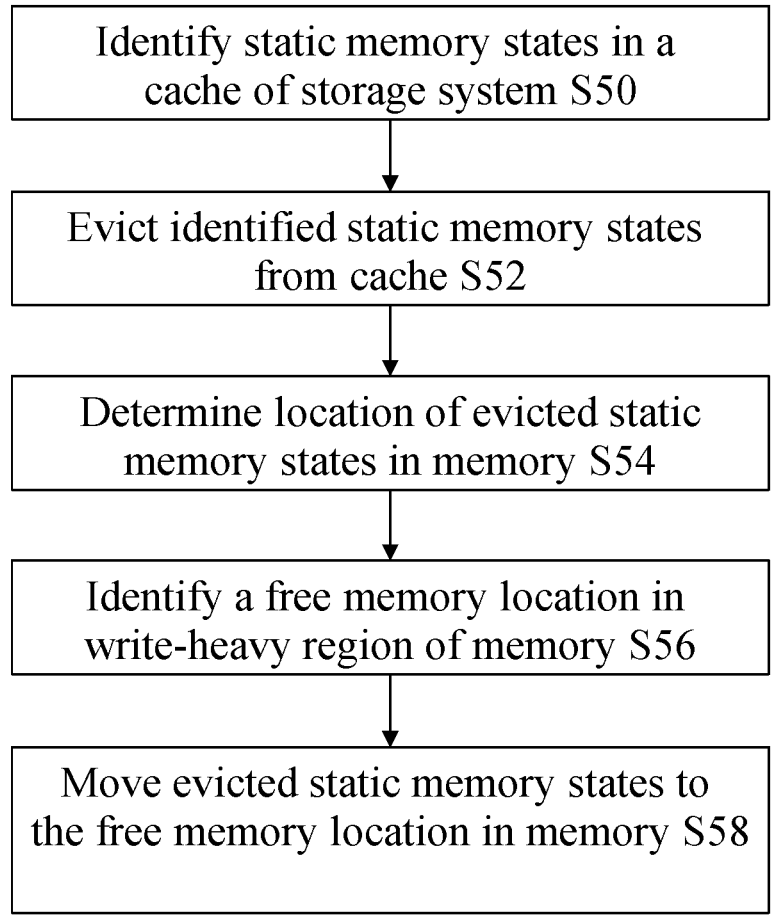
FIG. 5 is a flow diagram of an example process to perform wear-levelling in a storage system by identifying when static memory states are evicted from a cache.

FIG. 5 is a flow diagram of an example process to perform wear-levelling in a storage system (e.g. the storage system of FIG. 3) by identifying when static memory states are evicted from a cache. The process begins by identifying static memory states within a cache of a storage system (S50). Thus, in this example, static memory states are first identified within a cache, and not in the memory which is being wear-levelled. The static memory states within the cache corresponds to memory states stored within the memory being wear-levelled, but the cache is used to identify which memory states are static. Once this information is known, the corresponding location of the static memory states within the memory can be identified. The static memory states may be identified via a cache eviction scheme implemented by the cache. The cache eviction scheme may comprise evicting/removing memory states from the cache if, for example, the memory states are static (e.g. read-only) memory states and have not been accessed for a certain length of time, or have not be accessed often enough, to warrant keeping the memory states in the cache. The specific values for access time, access frequency, or access rate, which are used to determine if memory states are static memory states, may be usage- or implementation-specific. The cache eviction scheme is used to maintain an active memory state set in the cache. This may comprise determining if some memory states stored in other types of memory (e.g. in main memory) are accessed more often/frequently than some memory states in the cache, and if so, evicting the memory states in the cache to make room for the memory states stored elsewhere which is accessed more often/frequently. The cache eviction scheme employed by the storage system may itself define the parameters which are to be used to determine if memory states are static. Once identified, the cache evicts the static memory states from the cache (S52).

The next action in the wear-levelling process requires communicating the cache eviction to the memory being wear-levelled, so that the memory (or a controller thereof) may determine the corresponding location of the evicted memory states in the memory (S54). As mentioned earlier, this may comprise simply communicating the logical address of the evicted memory states or the memory page which was evicted from the cache. The physical memory may use this to determine, by mapping the logical address to the physical address, where the memory states evicted from the cache reside within the physical memory. Additionally or alternatively, the cache may be configured to evict clean memory states and send an instruction for the evicted clean memory states to be rewritten into the physical memory at the same location. The physical memory may be able to determine that the incoming write memory states are identical to the memory states already stored at that location within the physical memory, and may therefore conclude that the incoming memory states are unmodified, static memory states.

In the embodiment shown in FIG. 5, the wear-levelling process is configured to migrate static memory states in the physical memory every time the static memory states are evicted from the cache. Thus, each eviction of static memory states from the cache triggers migration of the same memory states within the physical memory. Additionally or alternatively, each eviction of static memory states from the cache triggers migration of any static memory states stored within the physical memory. In this case, the memory states evicted from the cache do not necessarily correspond to the memory states which are migrated in the physical memory. However, in this case, the physical memory would require another mechanism to determine which memory states stored in the physical memory are static memory states and which are dynamic memory states. This may require consulting a table which tracks the read heaviness of each memory block (whether a logical memory block or a physical memory block), in order to determine where static memory states are located in the physical memory and to select static memory states for migration.

Thus, once the location of static memory states (e.g. the memory states evicted from the cache) is found within the physical memory (e.g. volatile or non-volatile memory), the wear-levelling process has to identify a free memory location in a write heavy region within the physical memory (S56). Any technique may be used to identify a free memory location within a write heavy region or write heavy memory block of the physical memory. For example, a table (e.g. table 24 in FIG. 3) may store the number of writes for each memory page/memory block, and may increment the number each time a write takes place in each memory block. The table may also indicate whether or not each memory block is free or occupied.

The wear-levelling process comprises rewriting/migrating the identified static memory states to the identified free memory location within the physical memory (S58). In doing so, the location in the physical memory where the static memory states were previously stored is now free to store memory states, preferably dynamic memory states. Thus, memory locations within the physical memory become available when static memory states are migrated/moved to write heavy locations, thereby enabling writes to take place across more locations within the physical memory.

Each of S50 to S58 shown in FIG. 5 may be implemented using software, hardware, or a combination of software and hardware. The hardware may be a memory controller, which may be located in the CPU 12, in the interconnect 16 and/or within (or coupled to) the main memory 26. Preferably, the decision on whether to migrate static memory states within the physical memory 17, 18, and where to migrate the static memory states, is made by software/hardware that is located in, or coupled to, or operating on, the physical memory 17, 18.

Thus, in embodiments, identifying a memory location storing static memory states comprises identifying the memory location within a cache of the storage system.

In embodiments, the method may comprise evicting the static memory states from the identified memory location within the cache. In embodiments, the method may comprise communicating a logical address of the evicted static memory states to the memory being wear-levelled. In this case, identifying a memory location may comprise using the logical address of the evicted static memory states and a mapping table to determine a corresponding physical address of the evicted static memory states in the memory. Alternatively, the method may comprise sending an instruction to rewrite the evicted static memory states to the memory. In this case, identifying a memory location storing static memory states may comprise recognising that the evicted static memory states are identical to memory states already stored within the memory In embodiments, writing the stored static memory states to the free memory location in the non-volatile memory occurs after the evicting of the static memory states from the cache. In other words, in embodiments, the migration of static memory states may occur every time a cache eviction of static memory states is observed. As mentioned earlier, this may be a simple wear-levelling technique to implement, as no further decisions or calculations need to be performed in order to determine when to move static memory states in the memory, and which static memory states to move in the memory. (The static memory states migrated in this embodiment corresponds to the memory states that are evicted from the cache). However, this may result in too many writes taking place, which may impact the overall lifetime of the memory being wear-levelled.

In embodiments, it may not be useful or efficient to migrate memory states every time a static memory state eviction occurs because the physical memory may be written to shortly afterwards. Since migrating memory states is effectively a write, the number of writes to the physical memory may increase rapidly if the migration of static memory states occurs after every cache eviction. Therefore, in embodiments, it may be preferable to migrate memory states only after a predefined number of evictions have taken place, e.g. after every n static memory state evictions from the cache.

Figure 6:
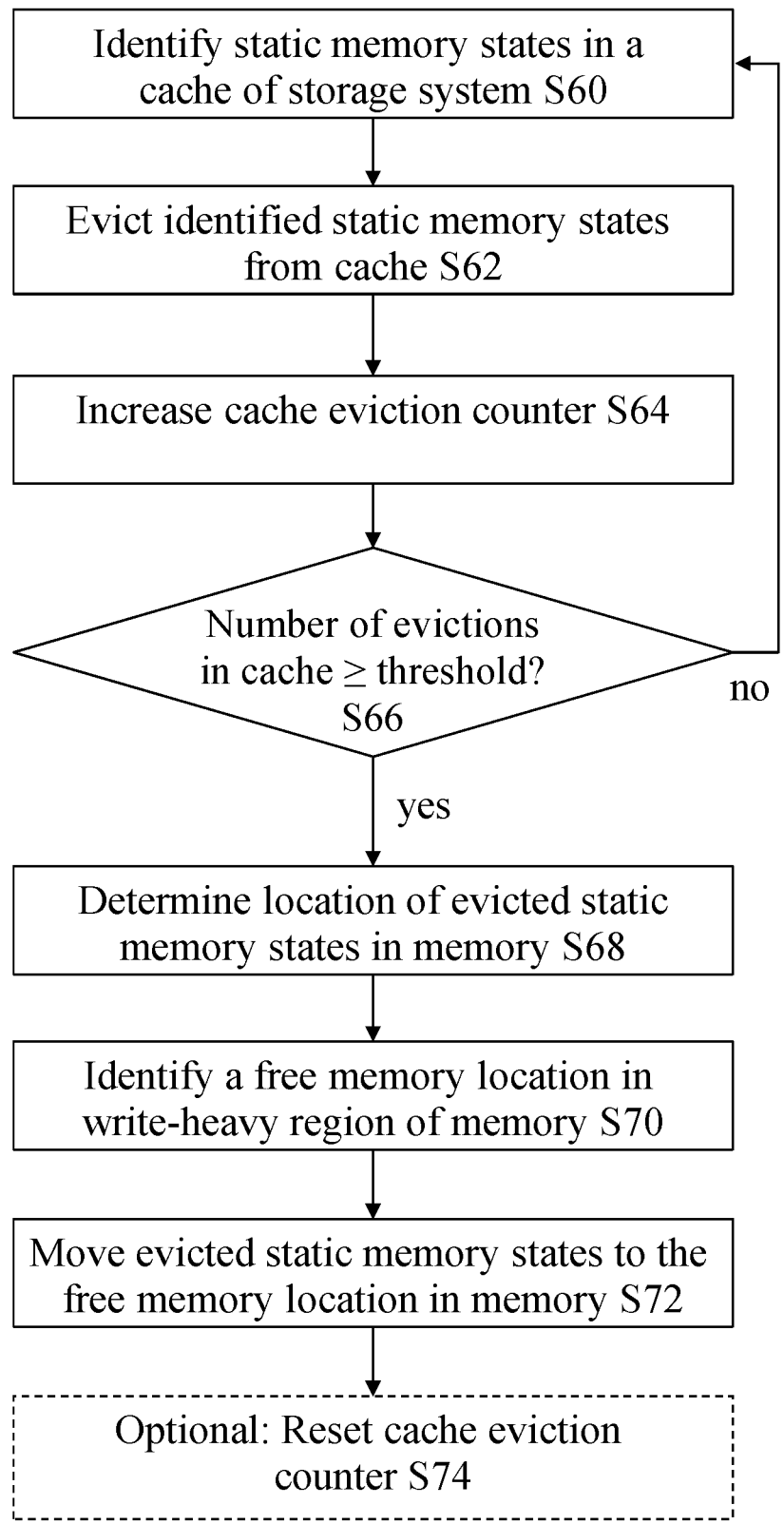
FIG. 6 is a flow diagram of an example process to perform wear-levelling in a storage system after a certain number of static memory state evictions from a cache.

FIG. 6 is a flow diagram of an example process to perform wear-levelling in a memory system after a certain number of static memory state evictions from a cache. Thus, in contrast to the embodiment of FIG. 5, in the embodiment of FIG. 6 every cache eviction of static memory states does not trigger a migration of static memory states within the physical memory. Instead, a migration of static memory states may only occur after a certain number of cache evictions have taken place.

The process begins by identifying static memory states/read-only memory states within a cache of a storage system (S60). Thus, in this example, static memory states are first identified within a cache, and not in a physical memory being wear-levelled. The static memory states within the cache corresponds to memory states stored within the memory being wear-levelled, but the cache is used to identify which memory states are static. Once this information is known, the corresponding location of the static memory states within the memory can be identified. The static memory states may be identified via a cache eviction scheme implemented by the cache. The cache eviction scheme may comprise evicting/removing memory states from the cache if, for example, the memory states are static (e.g. read-only) memory states and have not been accessed for a certain length of time, or have not be accessed often enough, to warrant keeping the memory states in the cache. The cache eviction scheme employed by the storage system may itself define the parameters which are to be used to determine if memory states are static. Once identified, the cache evicts the static memory states from the cache (S62).

In this embodiment, each eviction of static memory states from the cache is counted, e.g. using counter 22 in FIG. 3. Thus, once the identified static memory states are evicted from the cache, a cache eviction counter is increased/incremented by one (S64). The count of the cache eviction counter may be incremented by one each time static memory states are evicted from the cache, without being reset to zero, or may be reset to zero every time memory states are migrated within the physical memory. It will be understood that the amount by which the cache eviction counter is increased is arbitrary, and could be any value. It will also be understood that the cache eviction counter could equally be decremented from an initial value each time static memory states are evicted from the cache. In this case, once the cache eviction counter reaches zero, memory states may be migrated within the physical memory, and the cache eviction counter may be reset to the initial value.

In this embodiment, static memory states are migrated after a certain number of clean memory state evictions have been observed/have taken place in the cache. Thus, there may be a threshold number of evictions which trigger the action of static memory states migration. The threshold number may be any number. (The threshold number may be reached by incrementing a counter each time a cache eviction is observed, or may be the initial value of a counter which is decreased each time a cache eviction is observed). For example, the threshold number could be one (1), which effectively results in the wear-levelling process of FIG. 5 to be performed. In another example, the threshold could be several hundreds (100s) of evictions. The threshold number may depend on the workload of the physical memory, and/or on how aggressive the wear-levelling is required to be. Thus, for some types of physical memory the wear-levelling may be aggressive, e.g. if the endurance value of the memory type is low. The wear-levelling may be aggressive depending on the usage of the memory, e.g. if the memory is used in an environment in which lots of writes are going to occur. The threshold may change (or be time- or workload-dependent) or there may be a plurality of thresholds. For example, one threshold number may be used for when the program/erase rate in the memory is high, or when the memory is being used at a high rate, and another threshold number may be used for when the program/erase rate in the memory is low, or when the memory is not being used at a high rate. Thus, at S66, the value of the counter is compared to the threshold number (or whichever threshold number is appropriate at the time) to determine if the value of the counter is greater than or equal to the threshold number. If the value of the counter is less than the threshold number, no static memory state migration will be triggered, and the process returns to S60.

If at S66 the value of the counter is greater than or equal to the threshold number, the process to migrate static memory states in the physical memory is initiated. In order to begin the migration process, the physical memory (i.e. the software and/or hardware controlling the physical memory) is informed that the threshold value of cache evictions has been reached or exceeded. In embodiments, the physical memory may randomly select a memory block (memory location) containing static memory states and begin the process to move the selected memory block to a write heavy memory block (memory location) within the physical memory. This may require consulting a table which tracks the read heaviness of each memory block (whether a logical memory block or a physical memory block), in order to determine where static memory states are located in the physical memory and to select static memory states for migration. Additionally or alternatively, the logical address of the latest memory states to be evicted from the cache may be communicated to the physical memory, so that the physical memory may determine the corresponding physical address of the evicted memory states in the physical memory (S68). As mentioned earlier, this may comprise simply communicating the logical address of the evicted memory states or the memory page which was evicted. The physical memory may use this to determine, by mapping the logical address to the physical address, where the memory states evicted from the cache reside within the physical memory. Additionally or alternatively, the cache may be configured to evict clean memory states and send an instruction for the evicted clean memory states to be rewritten into the physical memory at the same location. In embodiments, this may occur after every clean eviction, but the software/hardware controlling the physical memory may discard/ignore the information if S66 is not satisfied (i.e. if the number of evictions is not greater than or equal to the threshold number). In embodiments, when S66 is satisfied, the cache may send the instruction with respect to the most recently evicted clean memory states. In any case, the physical memory may be able to determine that the incoming write memory states are identical to the memory states already stored at that location within the physical memory, and may therefore conclude that the incoming memory states are unmodified, static memory states.

Once the location of static memory states (e.g. the memory states evicted from the cache) is found within the physical memory (e.g. non-volatile memory or volatile memory), the wear-levelling process has to identify a free memory location in a write heavy region within a physical memory being wear-levelled (S70). Any technique may be used to identify a free memory location within a write heavy region or write heavy memory block of the physical memory. For example, a table (e.g. table 24 in FIG. 3) may store the number of writes for each memory page/memory block, and may increment the number each time a write takes place in each memory block. The table may also indicate whether or not each memory block is free or occupied.

The wear-levelling process comprises rewriting/migrating the identified static memory states to the identified free memory location within the storage system (S72). In doing so, the location in the physical memory where the static memory states were previously stored is now free to store memory states, preferably dynamic memory states. Thus, memory locations within the physical memory become available when static memory states are migrated/moved to write heavy locations, thereby enabling writes to take place across more locations within the physical memory.

Optionally, the cache eviction counter may be being reset to zero every time static memory states are migrated in the physical memory (S74). Alternatively, if the cache eviction counter is not reset to zero, the threshold number may be increased (e.g. multiplied by an integer) after each migration of static memory states, and the new threshold number is used at S66. For example, the threshold of the cache eviction counter may be set to X initially. After the first migration of static memory states, the threshold may be set to 2X, and after the second migration the threshold may be set to 3X, and so on.

Each of the S60 to S74 shown in FIG. 6 may be implemented using software, hardware, or a combination of software and hardware. The hardware may be a memory controller, which may be located in the CPU 12, in the interconnect 16 and/or within the main memory 26 (or component thereof). Preferably, the decision on whether to migrate static memory states within the physical memory 17, 18, and where to migrate the static memory states, is made by software/hardware that is located in, or coupled to, or operating on, the physical memory 17, 18.

Thus, in embodiments, identifying a memory location storing static memory states comprises tracking a number of reads of memory states stored at each memory location, and determining if the number of reads at each memory location is indicative of the stored memory states being static memory states. For example, if the number of reads at a memory location is above a threshold value (as indicated by a cache eviction counter, read counter, or otherwise), then it may be assumed that the memory location stores static memory states.

The embodiments of FIGS. 5 and 6 provide processes to migrate static memory states within a physical memory whenever a cache eviction of static memory states occurs, or whenever a certain number of cache evictions of static memory states have occurred. However, in some cases, this may not result in an efficient way to perform wear-levelling because some logical pages or memory blocks within a physical memory may be written/rewritten often and may be read often. Accordingly, a wear-levelling process which takes into account the number of reads of each logical page, or which takes into account the number of reads of and writes at each logical page, may be more efficient.

Figure 7:
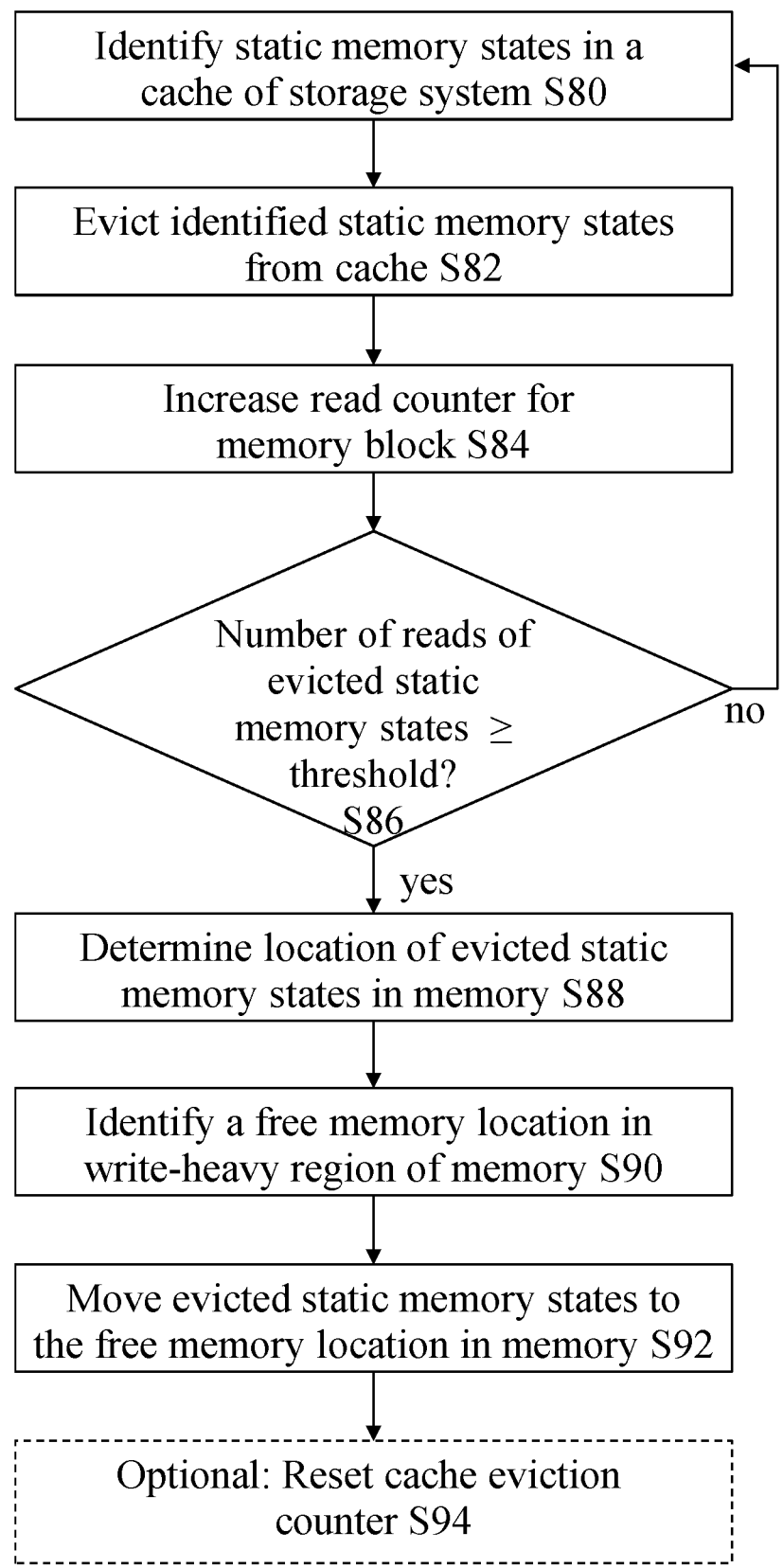
FIG. 7 is a flow diagram of an example process to perform wear-levelling in a storage system after a certain number of reads of static memory states.

FIG. 7 is a flow diagram of an example process to perform wear-levelling in a memory of a storage system after a certain number of reads of static memory states. In contrast to the embodiments of FIGS. 5 and 6, in the embodiment of FIG. 7, migration of static memory states within the physical memory of the storage system occurs only if the memory states evicted from a cache has been read a certain number of times. Thus, this embodiment is concerned with monitoring the "read heaviness" of logical pages/memory blocks and using this to determine if the memory blocks are read heavy memory blocks that should be migrated within the physical memory. As mentioned earlier, "read heaviness" is a measure of how many times memory states from a particular memory block have been read, or how many times memory states have been read from the memory block compared to the number of writes to the same memory block.

The process begins by identifying static memory states within a cache of a storage system (S80). Thus, in this example, static memory states are first identified within a cache, and not in a physical memory which is being wear-levelled. The static memory states within the cache corresponds to memory states stored within the memory being wear-levelled, but the cache is used to identify which memory states are static. Once this information is known, the corresponding location of the static memory states within the memory can be identified. The static memory states may be identified via a cache eviction scheme implemented by the cache. The cache eviction scheme may comprise evicting/removing memory states from the cache if, for example, the memory states are static (e.g. read-only) memory states and have not been accessed for a certain length of time, or have not be accessed often enough, to warrant keeping the memory states in the cache. The cache eviction scheme employed by the storage system may itself define the parameters which are to be used to determine if memory states are static. Once identified, the cache evicts the static memory states from the cache (S82).

In this embodiment, each eviction of static memory states from the cache is counted on a per memory block basis e.g. using counter 22 in FIG. 3. The number of cache evictions (or the number of reads from the cache/from the physical memory) of a memory block may be monitored and recorded in a table (e.g. table 24). The table may also comprise the maps from logical addresses to physical addresses for each logical page/memory page. Thus, once the identified static memory states are evicted from the cache, a read counter associated with that static memory states (i.e. with the logical address of the static memory states) may be increased/incremented by one (S84). The value of the read counter associated with each logical page may be incremented by one each time the logical page is evicted from the cache, without being reset to zero, or may be reset to zero every time the memory states corresponding to the logical page are migrated within the physical memory. It will be understood that the amount by which the cache eviction counter is increased is arbitrary, and could be any value. It will also be understood that the cache eviction counter could equally be decremented from an initial value each time static memory states are evicted from the cache. In this case, once the cache eviction counter reaches zero, memory states may be migrated within the physical memory, and the cache eviction counter may be reset to the initial value.

In this embodiment, static memory states are migrated after the memory states have been read a certain number of times. Thus, there may be a threshold number of reads which trigger the action of static memory states migration. The threshold number may be any number. For example, the threshold number could be anywhere from one read up to several hundreds of reads. (The threshold number may be reached by incrementing a counter each time a cache eviction is observed, or may be the initial value of a counter which is decreased each time a cache eviction is observed). The threshold number may depend on the workload of the physical memory, and/or on how aggressive the wear-levelling is required to be. Thus, for some types of physical memory the wear-levelling may be aggressive, e.g. if the endurance value of the memory type is low. The wear-levelling may be aggressive depending on the usage of the memory, e.g. if the memory is used in an environment in which lots of writes are going to occur. The threshold may change (or be time- or workload-dependent) or there may be a plurality of thresholds. For example, one threshold number may be used for when the program/erase rate in the memory is high, or when the memory is being used at a high rate, and another threshold number may be used for when the program/erase rate in the memory is low, or when the memory is not being used at a high rate. Thus, at S86, the value of the read counter for the evicted memory states is compared to the threshold number of reads (or whichever threshold number of reads is appropriate at the time) to determine if the value of the counter is greater than or equal to the threshold number. If the value of the counter is less than the threshold number, no static memory state migration will be triggered as the logical page is not considered to be a read heavy page, and the process returns to S80.

If at S86 the value of the counter is greater than or equal to the threshold number, the process to migrate static memory states in the physical memory is initiated. In order to begin the migration process, the physical memory (i.e. the software and/or hardware controlling the physical memory) is informed that the threshold value of reads has been reached or exceeded for the evicted memory states. The logical address of the evicted memory states may be communicated to the physical memory, so that the physical memory may determine the corresponding physical address of the evicted memory states in the physical memory (S88). As mentioned earlier, this may comprise simply communicating the logical address of the evicted memory states or the memory page which was evicted. The physical memory may use this to determine, by mapping the logical address to the physical address, where the memory states evicted from the cache reside within the physical memory. Additionally or alternatively, the cache may be configured to evict clean memory states and send an instruction for the evicted clean memory states to be rewritten into the physical memory at the same location. In embodiments, this may occur after every clean eviction, but the software/hardware controlling the physical memory may discard/ignore the information if S86 is not satisfied (i.e. if the number of reads of a logical page is not greater than or equal to the threshold number). In embodiments, when S86 is satisfied, the cache may send the instruction with respect to the most recently evicted clean memory states. In any case, the physical memory may be able to determine that the incoming write memory states are identical to the memory states already stored at that location within the physical memory, and may therefore conclude that the incoming memory states are unmodified, static memory states.

Once the location of static memory states (e.g. the memory states evicted from the cache) is found within the physical memory (e.g. non-volatile memory), the wear-levelling process has to identify a free memory location in a write heavy region within a physical memory (S90). Any technique may be used to identify a free memory location within a write heavy region or write heavy memory block of the physical memory. For example, a table (e.g. table 24 in FIG. 3) may store the number of writes for each memory page/memory block, and may increment the number each time a write takes place in each memory block. The table may also indicate whether or not each memory block is free or occupied.

The wear-levelling process comprises rewriting/migrating the identified static memory states to the identified free memory location within the physical memory (S92). In doing so, the location in the physical memory where the static memory states were previously stored is now free to store memory states, preferably dynamic memory states. Thus, memory locations within the physical memory become available when static memory states are migrated/moved to write heavy locations, thereby enabling writes to take place across more locations within the physical memory.

Optionally, the read counter for a memory page may be being reset to zero every time the memory states associated with the memory page are migrated in the physical memory (S94). Alternatively, if the read counter, is not reset to zero, the threshold number may be increased (e.g. multiplied by an integer) for that particular memory page after each migration of the memory states associated with the memory page, and the new threshold number is used at S86 for that memory page. For example, the threshold of the read counter may be set to X initially. After the first migration of static memory states, the threshold may be set to 2X, and after the second migration the threshold may be set to 3X, and so on. The threshold (or new threshold) may be saved within the table 24 in association with the relevant logical address.

Each of the S80 to S94 shown in FIG. 7 may be implemented using software, hardware, or a combination of software and hardware. The hardware may be a memory controller, which may be located in the CPU 12, in the interconnect 16 and/or within the main memory 26 (or component thereof). Preferably, the decision on whether to migrate static memory states within the physical memory 17, 18, and where to migrate the static memory states, is made by software/hardware that is located in, or coupled to, or operating on, the physical memory 17, 18.

In embodiments, writing the stored static memory states comprises: writing the stored static memory states to the free memory location when the number of reads of memory states stored at the identified memory location is greater than or equal to a threshold read number.

In embodiments, the method comprises storing the number of reads in a table within the storage system. The memory location storing static memory states may be a physical memory address of a plurality of physical memory addresses, and storing the number of reads may comprise: storing, for each of the plurality of physical memory addresses, the number of reads of memory states stored at the physical memory address. The memory location may be a memory block of a plurality of memory blocks within the storage system, and storing the number of reads may comprise: storing, for each of the plurality of memory blocks, the number of reads of memory states stored in the memory block.

In embodiments, tracking the number of reads comprises incrementing a counter (e.g. cache eviction counter or read counter) each time a read of the memory states or a cache eviction of the memory states is observed at each memory location within a memory of the storage system (e.g. volatile memory 17 or NVM 18). Writing the stored static memory states may comprise writing the stored static memory states to the free memory location when the counter is greater than or equal to a threshold number.

Figure 8:
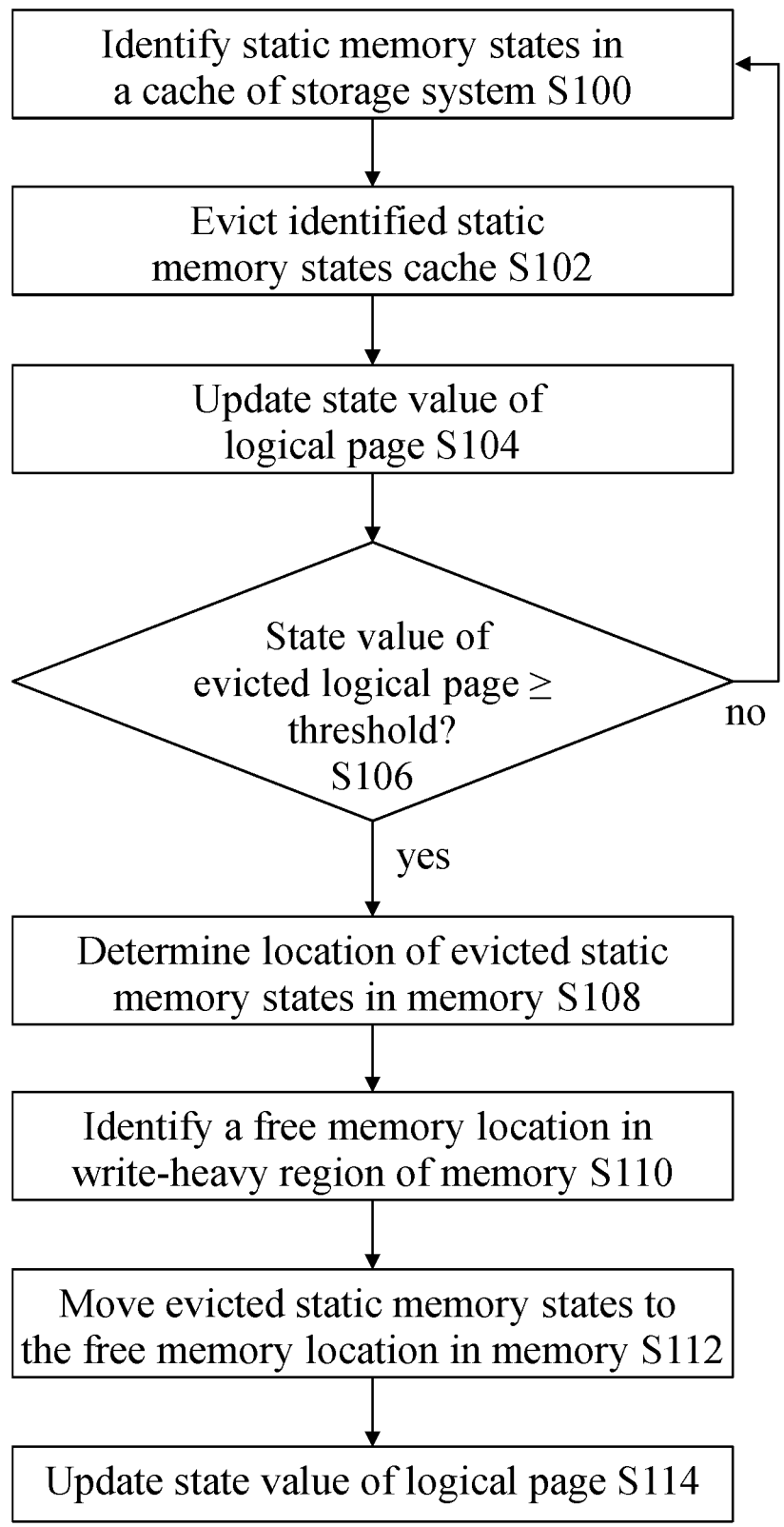
FIG. 8 is a flow diagram of an example process to perform wear-levelling in a storage system by tracking the number of reads and the number of writes at each memory location.

FIG. 8 is a flow diagram of an example process to perform wear-levelling in a storage system by tracking the number of reads and the number of writes of at each memory location (e.g. logical address or physical address) of a physical memory being wear-levelled. In contrast to the embodiments of FIGS. 5 and 6, in the embodiment of FIG. 8, migration of static memory states within the physical memory of a storage system occurs only if the memory states evicted from a cache have a particular state value. The state value for each memory location (e.g. each memory block, each physical address, etc.) is determined based on the number of reads/static memory state evictions of the memory states stored at the memory location and the number of writes/rewrites to the memory location. How the state value is determined is explained in more detail below with respect to FIGS. 11 and 12a. Thus, this embodiment is concerned with monitoring the read heaviness of logical pages/memory blocks as well as the number of writes, and using this to determine if the memory blocks are read heavy memory blocks that should be migrated within the physical memory. In other words, this embodiment takes into account the fact that memory states evicted from a cache may, at least occasionally, result in the evicted memory states being rewritten to physical memory, such that it may not be useful or efficient to migrate memory states every time a static memory state eviction occurs.

The process begins by identifying static memory states within a cache of a storage system (S100). Thus, in this example, static memory states are first identified within a cache, and not in a physical memory being wear-levelled. The static memory states within the cache correspond to memory states stored within the memory being wear-levelled, but the cache is used to identify which memory states are static. Once this information is known, the corresponding location of the static memory states within the memory can be identified. The static memory states may be identified via a cache eviction scheme implemented by the cache. The cache eviction scheme may comprise evicting/removing memory states from the cache if, for example, the memory states are static (e.g. read-only) memory states and have not been accessed for a certain length of time, or have not been accessed often enough, to warrant keeping the memory states in the cache. The cache eviction scheme employed by the storage system may itself define the parameters which are to be used to determine if memory states are static. Once identified, the cache evicts the static memory states from the cache (S102).

In this embodiment, each read of memory states from the cache (which corresponds to memory states stored in a memory block of the physical memory), and each write of the memory states into a memory block of the physical memory is tracked on a per memory block basis. The number of cache evictions (or the number of reads from the cache/from the physical memory) of a memory block may be monitored and recorded in a table (e.g. table 24), as well as the number of writes/rewrites of the memory block. In embodiments, the number of reads and number of writes may be converted in a single state value for each memory block, the state value being indicative of the read heaviness of the memory block. The table may also comprise the maps from logical addresses to physical addresses for each memory block. Thus, once the identified static memory states are evicted from the cache, the state value of the memory block/static memory states are updated (S104).

In this embodiment, static memory states located within a memory block of the physical memory are migrated when the corresponding state value of the memory block is greater than or equal to a threshold number. The threshold number may be indicative of a certain read heaviness value which triggers the action of static memory states migration from the memory block to another location within the physical memory. The threshold number may be any number. The threshold number may depend on the workload of the physical memory, and/or on how aggressive the wear-levelling is required to be, as mentioned earlier. Thus, at S106, the state value associated with the memory block of the physical memory in which the evicted static memory states are located (e.g. the logical page) is compared to the threshold number. If the state value is less than the threshold number, no static memory state migration will be triggered as the logical page is not considered to be a read heavy page, and the process returns to S100.

If at S106 the state value is greater than or equal to the threshold number, the process to migrate static memory states in the physical memory is initiated. In order to begin the migration process, the physical memory (i.e. the software and/or hardware controlling the physical memory) is informed that the threshold state value has been reached or exceeded for the evicted memory states. The logical address of the evicted memory states may be communicated to the physical memory, so that the physical memory may determine the corresponding physical address of the evicted memory states in the physical memory (S108). As mentioned earlier, this may comprise simply communicating the logical address of the evicted memory states or the memory page which was evicted. The physical memory may use this to determine, by mapping the logical address to the physical address, where the memory states evicted from the cache reside within the physical memory.

Once the location of static memory states (e.g. the memory states evicted from the cache) is found within the physical memory (e.g. non-volatile memory), the wear-levelling process has to identify a free memory location in a write heavy region within the physical memory (S110). Any technique may be used to identify a free memory location within a write heavy region or write heavy memory block of the physical memory. For example, the state values for each memory page/memory block of the physical memory may enable write heavy locations to be identified. Particular state values may indicate if a memory block is write heavy, while other state values may indicate if a memory block is read heavy. The table may also indicate whether or not each memory block is free or occupied.

The wear-levelling process comprises rewriting/migrating the identified static memory states to the identified free memory location within the physical memory (S112). In doing so, the location in the physical memory where the static memory states were previously stored is now free to store memory states, preferably dynamic memory states. Thus, memory locations within the physical memory become available when static memory states are migrated/moved to write heavy locations, thereby enabling writes to take place across more locations within the physical memory.

The state value of the memory block from where memory states were migrated (or the state value of the logical page associated with the migrated memory states) may be updated following the migration (rewrite) (S114). In this way, the state value for each memory block/logical page takes into account reads and writes. (The state value may also be updated every time memory states are written/rewritten to a memory block).

Each of S100 to S114 shown in FIG. 8 may be implemented using software, hardware, or a combination of software and hardware. The hardware may be a memory controller, which may be located in the CPU 12, in the interconnect 16 and/or within the main memory 26 (or component thereof). Preferably, the decision on whether to migrate static memory states within the physical memory 17, 18, and where to migrate the static memory states, are made by software/hardware that is located in, or coupled to, or operating on, the physical memory 17, 18.

In embodiments, tracking the number of reads may comprise: setting a counter to an initial value; modifying the initial value of the counter by a first value each time a read is observed at the identified memory location; and modifying the counter by a second value when the memory states at the identified memory location are modified or rewritten. Writing the stored static memory states may comprise: writing the memory states to the free memory location when the counter reaches a threshold number; and modifying, for the identified memory location, the counter by a third value after the memory states are written to the free memory location.

Preferably, the modification applied by the first value is mathematically opposite to (at least in terms of the mathematical function/operation), the modification applied by the second value. That is, if the first value is added to the initial value of the counter, the second value is subtracted from the counter, for example. Preferably, the first value and the second value are different. For example, the first value may be +5, while the second value may be −2. (It will be understood that these are merely exemplary values to illustrate the concept). Thus, in embodiments, tracking the number of reads may comprise: setting a counter to an initial value; decrementing the initial value of the counter by a first value each time a read is observed at the identified memory location; and incrementing the counter by a second value when the memory states at the identified memory location are modified or rewritten. Writing the stored static memory states may comprise: writing the memory states to the free memory location when the counter is greater than or equal to a threshold number; and incrementing, for the identified memory location, the counter by a third value after the memory states are written to the free memory location.

As explained below with reference to FIGS. 11, 12a and 12b, in embodiments, writing the stored static memory states may be subsequent to the counter being greater than or equal to a threshold number. Alternatively, writing the stored static memory states may comprise: monitoring an activity level at (or of) the storage system (or a component of the storage system); and writing the stored static memory states when the activity level is low. The term 'low' in this context generally means when the storage system (or component of the storage system, such as the memory being wear-levelled), is accessed less often than usual. For example, if a memory has an average access rate/access frequency, activity level is 'low' when the access rate/access frequency is below the average. The memory may experience times/phases when it is less accessed because an active memory state set (or working memory state set) being used by/operated on by the CPU is stored within the cache levels closer to the CPU, such that the last level cache and/or physical memory are not being accessed as much as at other times/phases. Alternatively, the memory may experience times/phases when it is less accessed because the CPU is not busy. For example, if the storage system, or a component of the storage system, is busy (e.g. is performing a certain number of operations/tasks), then it may be more efficient to migrate static memory states within the memory at a point in time when the storage system (or component thereof) is less busy. The phases when the activity level is low (or access rate/frequency is low) provide opportunities for the physical memory to perform maintenance tasks (such as wear-levelling) without having to stall any transactions that require the physical memory.

The wear-levelling method may comprise storing a value of the counter in a table within the storage system. In embodiments, the memory location storing static memory states is a physical memory address of a plurality of physical memory addresses, and storing the value of the counter comprises: storing the value of the counter for each of the plurality of physical memory addresses. In embodiments, the memory location is a memory block of a plurality of memory blocks within the storage system, and storing the value of the counter comprises:

storing the value of the counter for each of the plurality of memory blocks. The table may be an address mapping table which maps logical memory addresses to physical memory addresses.

As mentioned above, there are a number of methods by which static memory states may be identified as part of the wear-levelling process. Two example methods are now described with respect to FIGS. 9 and 10.

Figure 9:
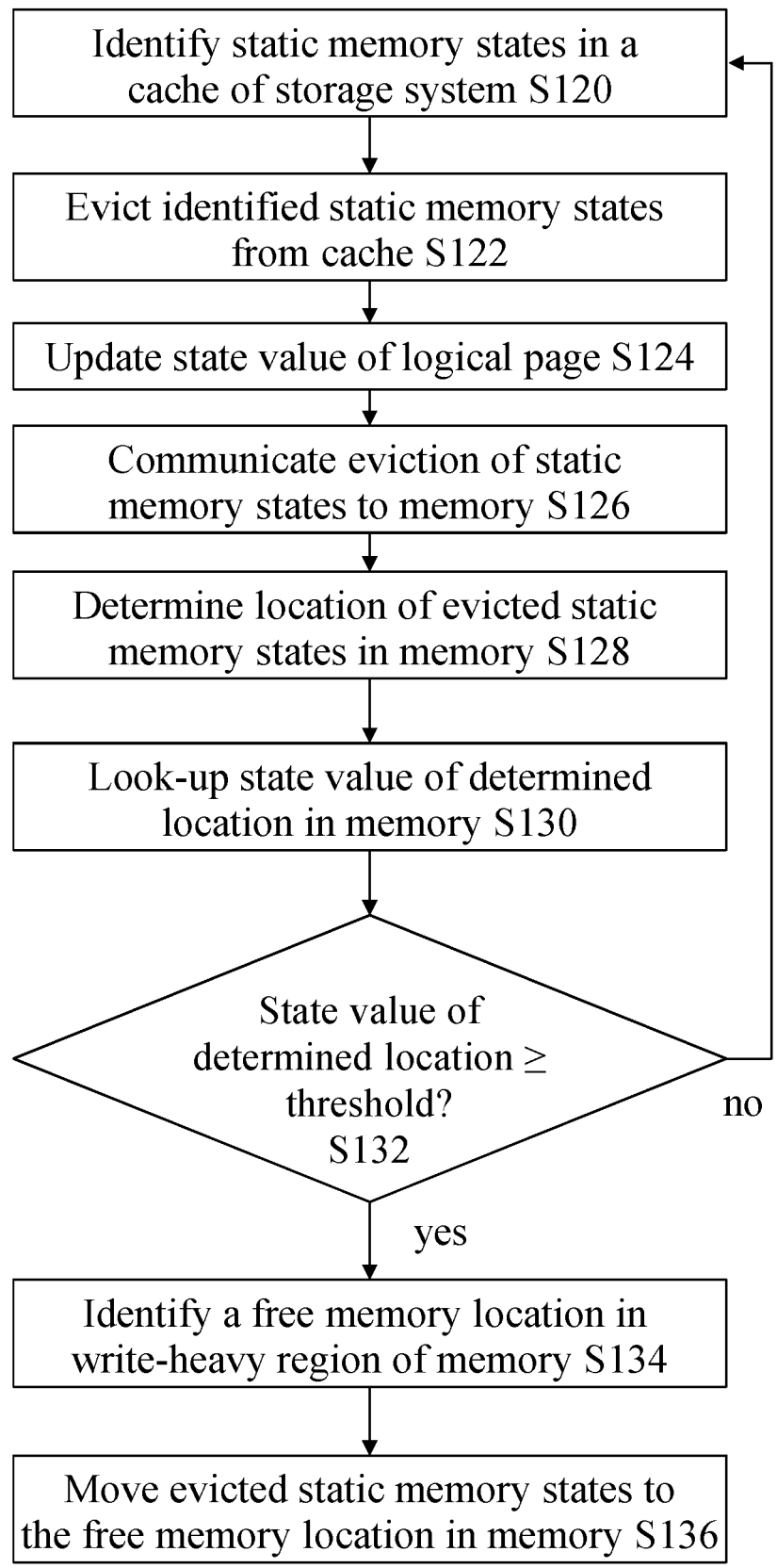
FIG. 9 is a flow diagram of an example process to perform wear-levelling in a storage system by communicating static memory state evictions in a cache to a physical memory.

FIG. 9 is a flow diagram of an example process to perform wear-levelling in a memory system by communicating static memory state evictions in a cache to a physical memory. The process begins by identifying static memory states/read-only memory states within a cache of a storage system (S120). Thus, in this example, static memory states are first identified within a cache, and not in a physical memory being wear-levelled. The static/read-only memory states may be identified via a cache eviction scheme implemented by the cache. The cache eviction scheme may comprise evicting/removing memory states from the cache if, for example, the memory states are static (e.g. read-only) memory states and have not been accessed for a certain length of time, or have not be accessed often enough, to warrant keeping the memory states in the cache. Once identified, the cache evicts the static memory states from the cache (S122).

In this embodiment, each read of a memory block from the cache (and possibly also each write of the memory block into the physical memory) is tracked on a per memory block basis. The number of cache evictions (or the number of reads from the cache/from the physical memory) of a memory block may be monitored and recorded in a table (e.g. table 24). In embodiments, the number of writes/rewrites of the memory block may also be recorded. In embodiments, the number of reads and number of writes may be converted in a single state value for each memory block, the state value being indicative of the read heaviness of the memory block. In embodiments, the state value may only take into account the number of reads. The table may also comprise the maps from logical addresses to physical addresses for each memory block. Thus, once the identified static memory states are evicted from the cache, the state value of the memory block/static memory states is updated (S124).

The eviction may be communicated to the physical memory (e.g. non-volatile memory) which is being wear-levelled (S126). The 'message' or signal sent to the physical memory may comprise the logical address of the memory states evicted from the cache. The physical memory may use the logical address to determine the corresponding physical address, i.e. the location of the evicted memory states within the physical memory (S128). This may comprise consulting a mapping table which maps logical addresses to physical addresses. The physical memory may look-up the state value of the determined physical address (S130) in order to determine the read heaviness of the location. The state value of each logical address/physical address may be stored in the mapping table, or may be stored in a separate table.

In this embodiment, static memory states within the physical memory is migrated when the corresponding state value of the memory block is greater than or equal to a threshold number. The threshold number may be indicative of a certain read heaviness value which triggers the action of static memory states migration from the memory block to another location within the physical memory. The threshold number may be any number. The threshold number may depend on the workload of the physical memory, and/or on how aggressive the wear-levelling is required to be, as mentioned earlier. Thus, at S132, the state value associated with the memory block of the physical memory in which the evicted static memory states are located (e.g. the logical page) is compared to the threshold number. If the state value is less than the threshold number, no static memory state migration will be triggered as the logical page is not considered to be a read heavy page, and the process returns to S120.

If at S132 the state value is greater than or equal to the threshold number, the process to migrate static memory states in the physical memory is initiated. The physical memory (i.e. the software and/or hardware controlling the physical memory) identifies a free memory location in a write heavy region within the memory (S134). Any technique may be used to identify a free memory location within a write heavy region or write heavy memory block of the physical memory. For example, the state values for each memory page/memory block may enable write heavy locations to be identified. Particular state values may indicate if a memory block is write heavy, while other state values may indicate if a memory block is read heavy. The table may also indicate whether or not each memory block is free or occupied.

The wear-levelling process comprises rewriting/migrating the identified static memory states to the identified free memory location within the physical memory (S136). In doing so, the location in the physical memory where the static memory states were previously stored is now free to store memory states, preferably dynamic memory states. Thus, memory locations within the physical memory become available when static memory states are migrated/moved to write heavy locations, thereby enabling writes to take place across more locations within the physical memory.

The state value of the memory block from where memory states were migrated (or the state value of the logical page associated with the migrated memory states) may be updated following the migration (rewrite). In this way, the state value for each memory block/logical page takes into account reads and writes. (The state value may also be updated every time memory states are written/rewritten to a memory block).

Each of S120 to S136 shown in FIG. 9 may be implemented using software, hardware, or a combination of software and hardware. The hardware may be a memory controller, which may be located in the CPU 12, in the interconnect 16 and/or within the main memory 26 (or component thereof). Preferably, the decision on whether to migrate static memory states within the physical memory 17, 18, and where to migrate the static memory states, is made by software/hardware that is located in, or coupled to, or operating on, the physical memory 17, 18.

Figure 10:
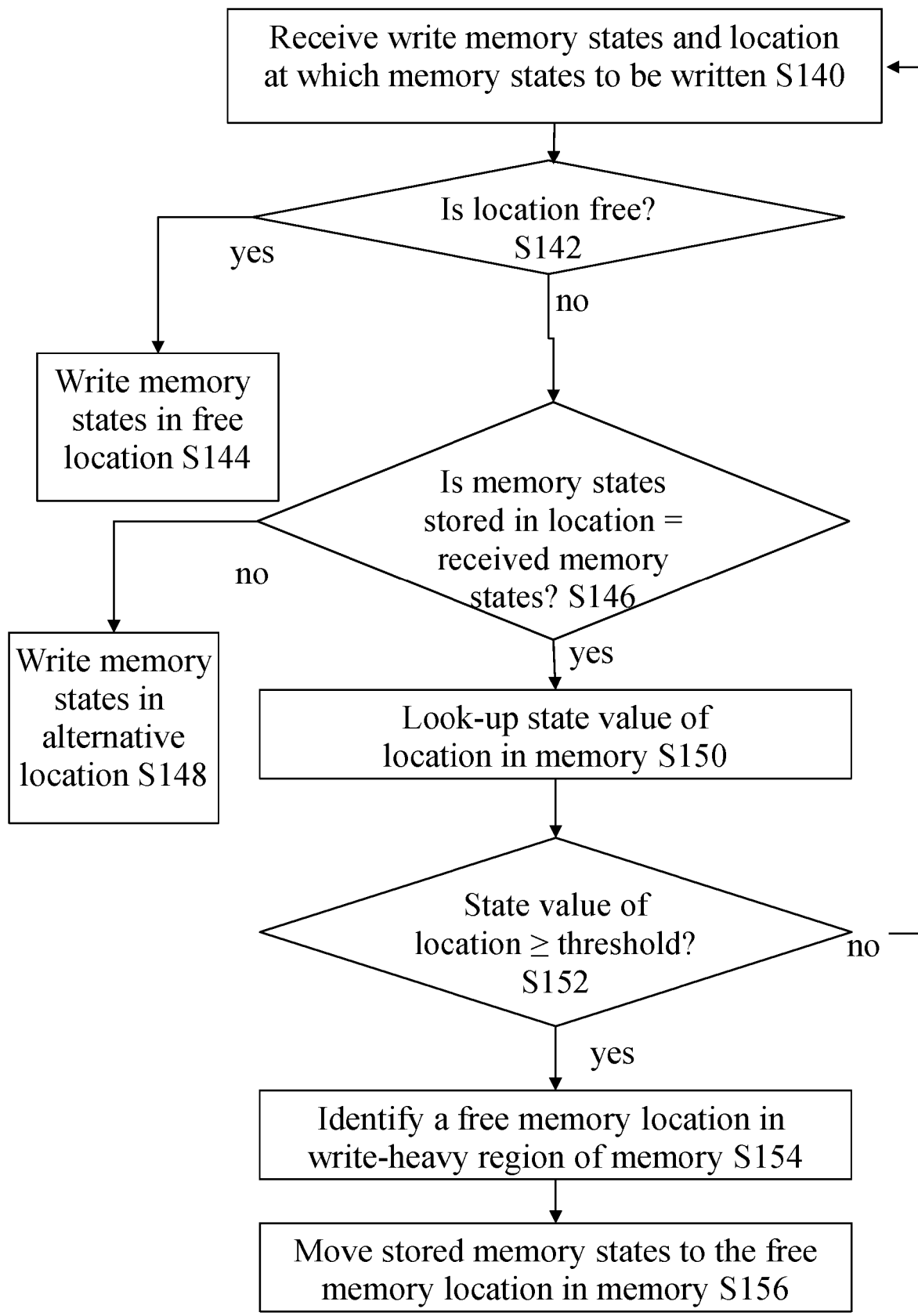
FIG. 10 is a flow diagram of an example process to perform wear-levelling in a storage system by re-writing static memory states into a physical memory.

FIG. 10 is a flow diagram of an example process to perform wear-levelling in a storage system by re-writing static memory states into a physical memory (e.g. a non-volatile memory). In this embodiment, static memory states are identified within the physical memory being wear-levelled. The process begins when the physical memory receives write memory states for writing into the physical memory, and instructions on where in the physical memory the received memory states are to be written (S140). The instructions on where the received memory states are to be written may comprise a specific physical address. The instructions may be received from a cache which has evicted the memory states that are now being written back into the memory.

The physical memory determines if the specified location is free for storing the received write memory states (S142). If the location is free, the received write memory states are written into the free location (S144). In this case, the physical memory may assume that the received write memory states are new memory states that are not already stored within the physical memory, and the process to identify static memory states ends.

If the specified location is not free, the physical memory determines if the memory states already stored at the specified location are identical to the received write memory states (S146). This may comprise performing some sort of comparison of the two sets of memory states. If the stored memory states are not identical to the received write memory states, the physical memory may assume that the received write memory states are new memory states that are not already stored within the physical memory. The physical memory may find an alternative location to store the received write memory states (S148), and the process to identify static memory states ends.

If the stored memory states at the specified location are identical to the received write memory states, the physical memory may be configured to assume that the received write memory states are static memory states (e.g. read-only memory states). In this case, the physical memory has identified static memory states.

The physical memory may decide whether or not to migrate the identified static memory states within the physical memory, using for example, one of the techniques described earlier. In embodiments, the physical memory may look-up the state value of the specified location (S150) in order to determine the read heaviness of the location. The state value of each location may be stored in a mapping table, or may be stored in a separate table. The identified static memory states may be migrated when the corresponding state value of the specified location is greater than or equal to a threshold number. The threshold number may be indicative of a certain read heaviness value which triggers the action of static memory state migration from the memory block to another location within the physical memory. The threshold number may be any number. The threshold number may depend on the workload of the physical memory, and/or on how aggressive the wear-levelling is required to be, as mentioned earlier. Thus, at S152, the state value associated with the specified location is compared to the threshold number. If the state value is less than the threshold number, no static memory states migration will be triggered as the specified location is not considered to be a read heavy location, and the process returns to S140.

If at S152 the state value is determined to be greater than or equal to the threshold number, the process to migrate static memory states in the physical memory is initiated. The physical memory (i.e. the software and/or hardware controlling the physical memory) identifies a free memory location in a write heavy region within the physical memory (S154). Any technique may be used to identify a free memory location within a write heavy region or write heavy memory block of the physical memory. For example, the state values for each memory page/memory block may enable write heavy locations to be identified. Particular state values may indicate if a memory block is write heavy, while other state values may indicate if a memory block is read heavy. The table may also indicate whether or not each memory block is free or occupied.

The wear-levelling process comprises rewriting/migrating the identified static memory states to the identified free memory location within the storage system (S156). In doing so, the location in the physical memory where the static memory states were previously stored is now free to store memory states, preferably dynamic memory states. Thus, memory locations within the storage system become available when static memory states are migrated/moved to write heavy locations, thereby enabling writes to take place across more locations within the physical memory.

The state value of the specified location in the memory from where memory states were migrated may be updated following the migration (rewrite). In this way, the state value for each memory location of the physical memory takes into account both reads and writes.

Each of S140 to S156 shown in FIG. 10 may be implemented using software, hardware, or a combination of software and hardware.

As mentioned above, the state value of a memory block of a physical memory may be based on the number of reads of the memory block and the number of writes to the memory block. In other words, the state value may be a measure of the read heaviness (and/or write heaviness) of a memory block. Two example algorithms for tracking/updating the state value of a memory block are now described.

Figure 11:
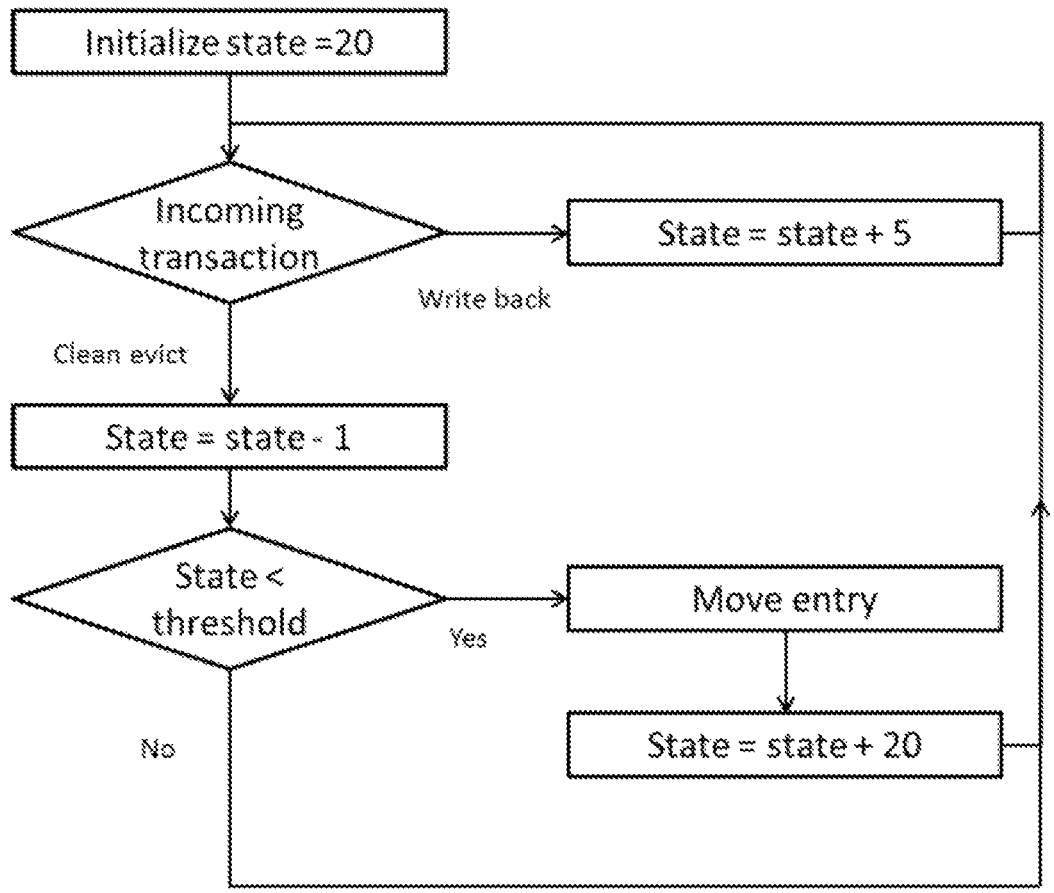
FIG. 11 shows a flow chart of an example synchronous algorithm to determine a state value of a memory block and determine whether to migrate memory states stored in the memory block after each read.
Figure 12:
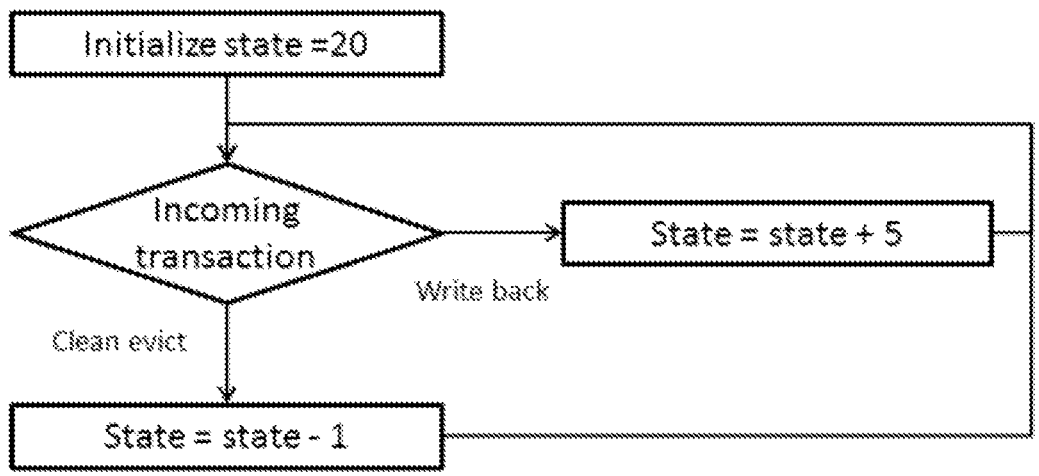
FIG. 12a shows a tracking part of an asynchronous algorithm.
FIG. 12b shows a decision part of the asynchronous algorithm.
Figure 12:
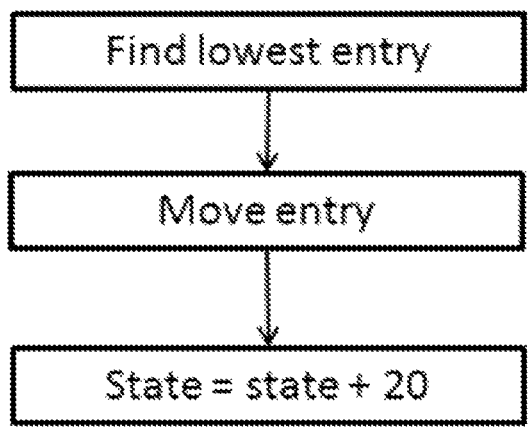

FIG. 11 shows a flow chart of an example algorithm to determine a state value of a memory block in a physical memory. Each memory block may be assigned an initial state value when the physical memory is created or first used. Each memory block within the physical memory is preferably given the same initial state value. Merely for illustrative purposes, the initial state value may be twenty (20). Each action performed on/to a memory block alters the state value of the block. For example, if memory states are written to the memory block, the state value may be increased. Merely for illustrative purposes, the state value may be increased by five (5) each time memory states are written to the memory block. If memory states are read from the memory block (or evicted from a cache), the state value may be decreased. Merely for illustrative purposes, the state value may be decreased by one (1) each time a read/clean eviction occurs. Thus, in this example algorithm, the state value of a memory block decreases every time a read/clean eviction occurs, such that a low state value may be indicative of a read heavy memory block, whereas a high state value may be indicative of a write heavy memory block. The low state value may be low relative to the initial state value, or relative to some threshold number. Similarly, the high state value may be high relative to the initial state value, or relative to some threshold number.

When the state value of the memory block is determined to be below a threshold number (which may be indicative of a read heavy location), the memory states within the memory block are assumed to be static memory states, or memory states which are more heavily read than rewritten. Accordingly, the memory states within the memory block are migrated/moved to another location within the physical memory (i.e. a free, write heavy location) to spread out writes across the physical memory. When the memory states are migrated, the state value of the memory block is increased as a way of 'resetting' the state value. Merely for illustrative purposes, the state value may be increased by twenty (20). If the state value of the memory block is determined to be equal to or greater than the threshold value, no action is taken.

The values shown within FIG. 11 are merely illustrative and are non-limiting. In embodiments, the modification made to the state value when a write occurs may preferably be a larger value than the modification made when a read occurs, so that each read does not automatically cause migration of the memory states.

The algorithm shown in FIG. 11 is an example of a synchronous algorithm, because a decision on whether to migrate memory states is made every time a read occurs. FIGS. 12a and 12b show an example asynchronous algorithm to determine a state value of a memory block in a physical memory. FIG. 12a shows a tracking part of the asynchronous algorithm, while FIG. 12b shows a decision part of the asynchronous algorithm. FIG. 12a shows how the state value may be modified each time a read or write occurs. However, rather than make a decision on whether to migrate memory states after every read, the tracking part simply continues to modify the state value of the memory block each time a read/write takes place. The decision on whether to migrate memory states within the memory block is made at a different time. For example, the decision part of the algorithm (shown in FIG. 12b) may be initiated when the memory is not being used, or when there is minimal memory interaction. This may be useful because all required memory state migrations could be performed together, or substantially together, when the memory usage rate is low (e.g. when a device containing the memory is in sleep mode). If the memory usage rate is high (i.e. the memory is 'busy'), then processes requiring access to memory may be slowed down or negatively impacted if memory state migration is taking place at the same time. Thus, it may be useful not to migrate memory states as soon as a memory block state value is below the threshold, but to instead wait for the memory usage to become less busy.

Embodiments of the present techniques also provide a non-transitory memory state carrier carrying code which, when implemented on a processor, causes the processor to carry out the methods described herein.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory memory state carrier or on a non-transitory computer-readable medium such as a disk, microprocessor, CD- or DVD-ROM, programmed memory such as read-only memory (firmware), or on a memory state carrier such as an optical or electrical signal carrier. The code may be provided on a (non-transitory) carrier such as a disk, a microprocessor, CD- or DVD-ROM, programmed memory such as non-volatile memory (e.g. Flash) or read-only memory (firmware). Code (and/or memory states) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or memory states may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a memory state carrier having functional memory states thereon, said functional memory states comprising functional computer data structures to, when loaded into a computer system or network and operated upon thereby, enable said computer system to perform the above-described method.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

The invention claimed is:

1. A method of wear-levelling, the method comprising:
identifying, within a central processing unit (CPU) cache of a storage system, a memory location storing static memory states;
evicting the static memory states from the identified memory location within the CPU cache; and, responsive to the evicting the static memory states:
determining a location, within a memory of the storage system separated from the CPU cache by an interconnect, containing static memory states which match the evicted static memory states;
identifying a free memory location in a write heavy region within the memory separated from the CPU cache by the interconnect; and
migrating the static memory states contained at the determined location from the determined location to the free memory location in the write heavy region within the memory separated from the CPU cache by the interconnect.

2. The method as claimed in claim 1, further comprising communicating a logical address of the evicted static memory states to the memory separated from the CPU cache by the interconnect.

3. The method as claimed in claim 2, wherein identifying the memory location further comprises using the logical address of the evicted static memory states and a mapping table to determine a corresponding physical address of the evicted static memory states in the memory separated from the CPU cache by the interconnect.

4. The method as claimed in claim 2, further comprising sending an instruction to rewrite the evicted static memory states to the memory separated from the CPU cache by the interconnect.

5. The method as claimed in claim 2, wherein migrating the static memory states contained at the determined location to the free memory location in the memory separated from the CPU cache by the interconnect occurs subsequent to the evicting of the static memory states separated from the CPU cache by the interconnect.

6. The method as claimed in claim 2, wherein identifying a memory location storing static memory states comprises:
tracking a number of reads of memory states stored in at least one memory location; and
determining whether the number of reads of memory states stored in the at least one memory location is indicative of the stored memory states being static memory states.

7. The method as claimed in claim 6, wherein migrating the static memory states contained at the determined location comprises:
writing the static memory states contained at the determined location to the free memory location responsive at least in part to the number of reads of memory states stored in the at least one memory location being greater than or equal to a threshold number of reads.

8. The method as claimed in claim 6, further comprising: storing the number of reads of memory states stored in the at least one memory location in a table within the storage system.

9. The method as claimed in claim 8, wherein:
the memory location storing static memory states comprises a physical memory address of a plurality of physical memory addresses and storing the number of reads comprises storing, for at least one of the plurality of physical memory addresses, the number of reads of memory states stored at the physical memory address; and/or
the memory location comprises a memory block of a plurality of memory blocks within the memory of the storage system separated from the CPU cache by the interconnect and storing the number of reads of memory states stored in the at least one memory location comprises storing, for at least one of the plurality of memory blocks, a number of reads of memory states stored in the memory block.

10. The method as claimed in claim 6, further comprising: incrementing a counter responsive, at least in part, to occurrences of a read of memory states and/or a cache eviction of memory states observed at the at least one memory location.

11. The method as claimed in claim 6, further comprising: setting a counter to an initial value;
decrementing the initial value of the counter by a first value responsive, at least in part, to observation of a read at the identified memory location; and
incrementing the counter by a second value responsive, at least in part, to modification and/or rewriting of memory states at the identified memory location.

12. The method as claimed in claim 8, wherein the table to comprise an address mapping table to map logical memory addresses to physical memory addresses.

13. A non-transitory storage medium to comprise processor-readable instructions stored thereon which are executable by a processor to cause the processor to:
identify, within a central processing unit (CPU) cache of a storage system, a memory location storing static memory states;
evict the static memory states from the identified memory location within the CPU cache; and, responsive to eviction of the static memory states from the identified memory location with the CPU cache:
determine a location within a memory of the storage system, separate separated from the CPU cache by an interconnect, containing static memory states which match the evicted static memory states;
identify a free memory location in a write heavy region within the memory of the storage system separated from the CPU cache by the interconnect; and migrate the static memory states contained at the determined location from the determined location to the free memory location in the write heavy region within the memory separated from the CPU cache by the interconnect.

14. A storage system comprising:
at least one central processing unit (CPU) cache;
an interconnect;
a memory separated from the CPU cache by the interconnect; and a memory controller to:
  identify, within the at least one CPU cache of the storage system, a memory location storing static memory states;
  evict the static memory states from the identified memory location within the CPU cache; and, responsive to eviction of the static memory states from the identified memory location with the cache:
  determine a location within the memory separated from the CPU cache by the interconnect containing static memory states which match the evicted static memory states;
  identify a free memory location in a write heavy region within the memory separated from the CPU cache by the interconnect; and
migrate the static memory states contained at the determined location from the determined location to the free memory location in the write heavy region within the memory separated from the CPU cache by the interconnect.

15. The storage system as claimed in claim 14, wherein the memory separate from the CPU cache comprises: flash memory, phase change memory, resistive random access memory (RERAM), random access memory (RAM), dynamic RAM (DRAM), static RAM (SRAM), non-volatile RAM or Correlated Electron RAM (CeRAM), or a combination thereof.

16. The method as claimed in claim 6, comprising:
setting a counter to an initial value;
modifying the initial value of the counter by a first value responsive, at least in part, to occurrences of a read of memory states observed at the at least one memory location; and
modifying a value of the counter by a second value responsive, at least in part, to a modification and/or rewriting of memory states at the at least one memory location.

17. The method as claimed in claim 2, comprising:
responsive to evicting a static memory state from the CPU cache, incrementing or decrementing a counter;
comparing a value of the counter to a threshold number; and
executing the determining, identifying, and migrating steps responsive to a determination that the value of the counter has reached the threshold number.

* * * * *